United States Patent
Lee et al.

(10) Patent No.: US 10,014,039 B2
(45) Date of Patent: Jul. 3, 2018

(54) METHOD AND CIRCUIT FOR SELF-TRAINING OF A REFERENCE VOLTAGE AND MEMORY SYSTEM INCLUDING THE SAME

(71) Applicant: Samsung Electronics Co., Ltd., Suwon-si (KR)

(72) Inventors: Seon-Kyoo Lee, Hwaseong-si (KR); Jeong-Don Ihm, Seongnam-si (KR); Byung-Hoon Jeong, Hwaseong-si (KR); Dae-Woon Kang, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/333,468

(22) Filed: Oct. 25, 2016

(65) Prior Publication Data
US 2017/0287535 A1   Oct. 5, 2017

(30) Foreign Application Priority Data

Mar. 31, 2016   (KR) .................. 10-2016-0039099

(51) Int. Cl.
*G11C 7/10*   (2006.01)
*G11C 7/14*   (2006.01)

(52) U.S. Cl.
CPC .............. *G11C 7/14* (2013.01); *G11C 7/1057* (2013.01)

(58) Field of Classification Search
CPC .............................. G11C 7/14; G11C 7/1057
USPC ........................................ 365/189.05, 189.07
See application file for complete search history.

(56) References Cited

U.S. PATENT DOCUMENTS

| | | | |
|---|---|---|---|
| 7,230,449 B2 | 6/2007 | Dreps et al. | |
| 7,427,935 B2 | 9/2008 | Kim | |
| 8,559,241 B2 | 10/2013 | Park et al. | |
| 8,649,229 B2 | 2/2014 | Vergis et al. | |
| 8,994,401 B2 | 3/2015 | Hatakeyama et al. | |
| 9,196,325 B2 | 11/2015 | Eom et al. | |
| 2015/0213878 A1 | 7/2015 | Hashimoto | |
| 2015/0263703 A1* | 9/2015 | Ko | G11C 7/14 327/143 |
| 2015/0270010 A1 | 9/2015 | Kang | |
| 2016/0041943 A1 | 2/2016 | Hollis | |

* cited by examiner

*Primary Examiner* — Huan Hoang
(74) *Attorney, Agent, or Firm* — Muir Patent Law, PLLC

(57) ABSTRACT

A semiconductor device, includes at least a first memory chip, which includes at least a first buffer connected to receive an input signal and a reference voltage; at least a first reference voltage generator configured to output a reference voltage based on a first control code; and at least a first self-training circuit for determining an operational reference voltage to use during a normal mode of operation of the semiconductor device. An output from the first buffer is input to the first self-training circuit, the first control code is output from the first self-training circuit into the first reference voltage generator, and the first buffer, the first self-training circuit, and the first reference voltage generator form a loop.

20 Claims, 31 Drawing Sheets

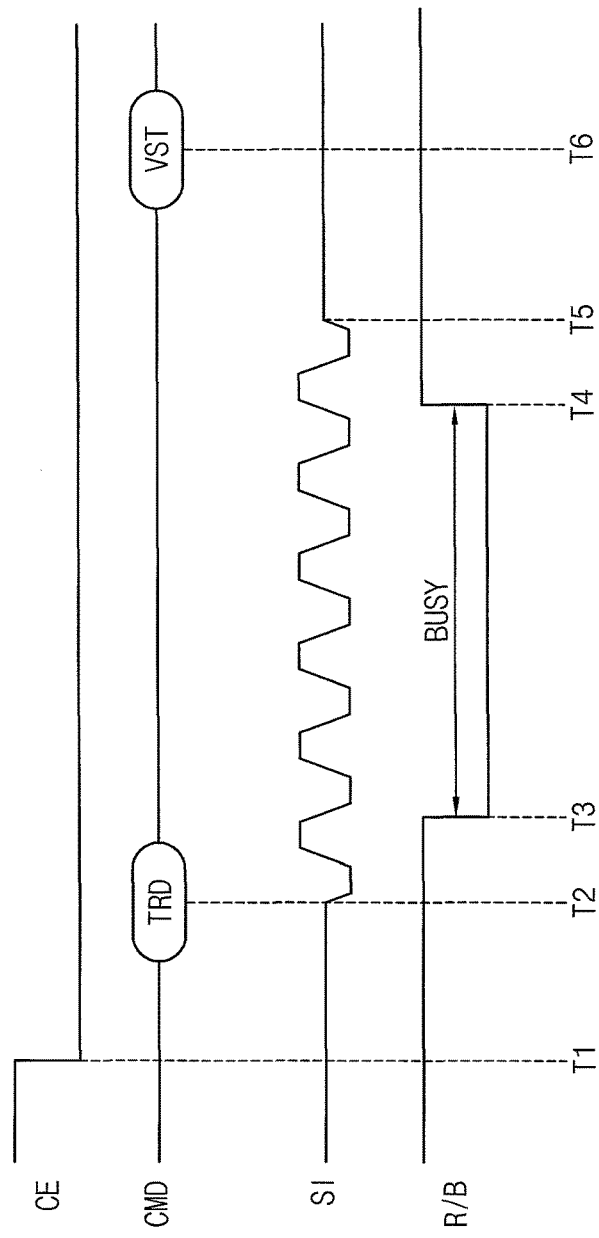

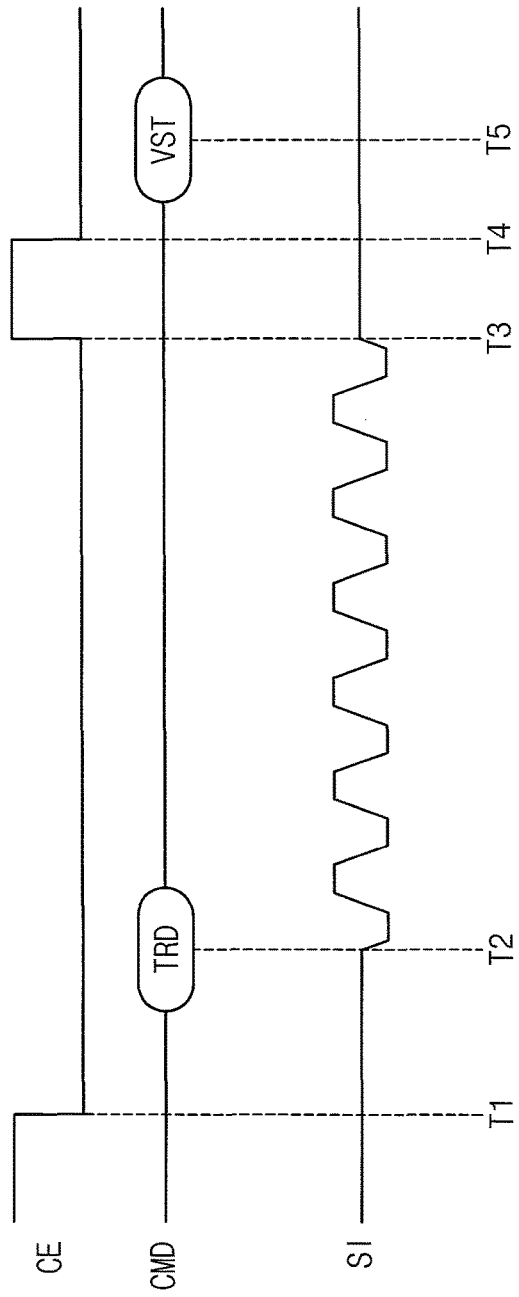

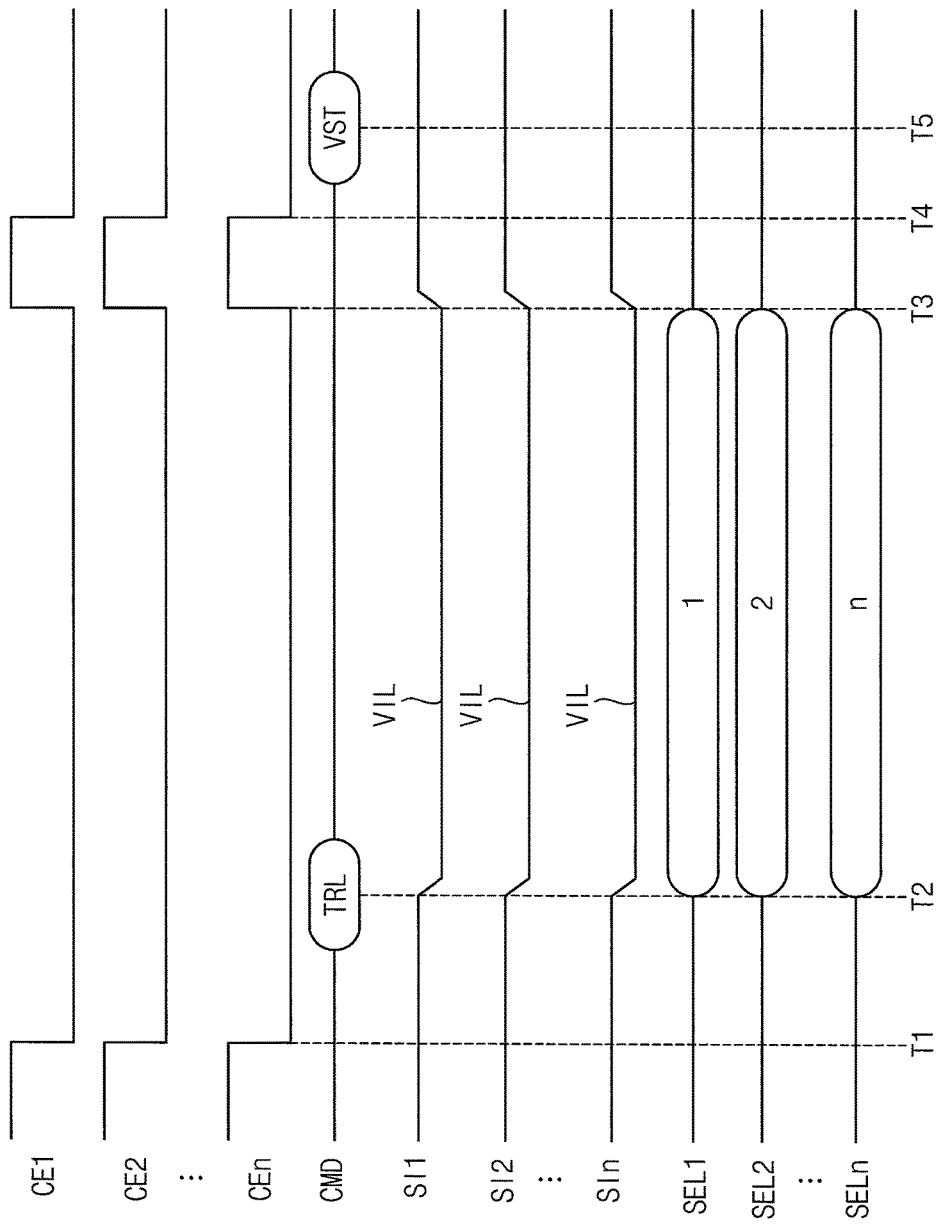

METHOD AND CIRCUIT FOR SELF-TRAINING OF A REFERENCE VOLTAGE AND MEMORY SYSTEM INCLUDING THE SAME

CROSS-REFERENCE TO RELATED APPLICATION

This U.S. Non-provisional application claims priority under 35 USC § 119 to Korean Patent Application No. 10-2016-0039099, filed on Mar. 31, 2016, in the Korean Intellectual Property Office (KIPO), the disclosure of which is incorporated by reference in its entirety herein.

BACKGROUND

1. Technical Field

Example embodiments relate generally to semiconductor integrated circuits, and more particularly to a method and circuit for self-training of a reference voltage, and a memory system including the circuit.

2. Discussion of the Related Art

In comparison with a semiconductor device receiving a differential signal, a semiconductor device receiving a single-ended signal typically requires a reference voltage for determining a logic level of a received signal. It is desirable to set the voltage level of the reference voltage to a mean value of the low voltage level and the high voltage level of the received signal.

A semiconductor device adopting single-ended signaling or pseudo-differential signaling may compare the voltage level of the received signal with the reference voltage using a reception buffer including a comparator. The reception buffer may generate an internal signal of the logic high level when the voltage level of the received signal is higher than the reference voltage and generate the internal signal of the logic low level when the voltage level of the received signal is lower than the reference voltage. The generated or buffered internal signal is transferred to an internal circuit of the semiconductor device.

If the voltage level of the reference voltage is improper or inaccurate, errors may increase in determining the logic levels of the received signals and thus performance of the system may be degraded. The setup and hold times for latching the received signal are shortened as the data transfer rate is increased and thus the reference voltage of a more accurate level is desirable.

SUMMARY

At least one example embodiment of the present disclosure may provide a reception interface circuit capable of efficiently providing a reference voltage and a method of providing a reference voltage.

At least one example embodiment of the present disclosure may provide a memory system including a reception interface circuit capable of efficiently providing a reference voltage.

At least one example embodiment of the present disclosure may provide a memory package including a reception interface circuit capable of efficiently providing a reference voltage.

At least one example embodiment of the present disclosure may provide a method of self-training of a reference voltage capable of efficiently providing a reference voltage.

BRIEF DESCRIPTION OF THE DRAWINGS

Example embodiments of the present disclosure will be more clearly understood from the following detailed description taken in conjunction with the accompanying drawings.

FIGS. 17A, 17B, 18A, 18B, 19A, 19B, 20A and 20B are timing diagrams illustrating example embodiments of a training mode in the system of FIG. 16.

FIG. 26 is a timing diagram illustrating an example embodiment of a training mode in the memory system of FIG. 25.

DETAILED DESCRIPTION

Figure 1:
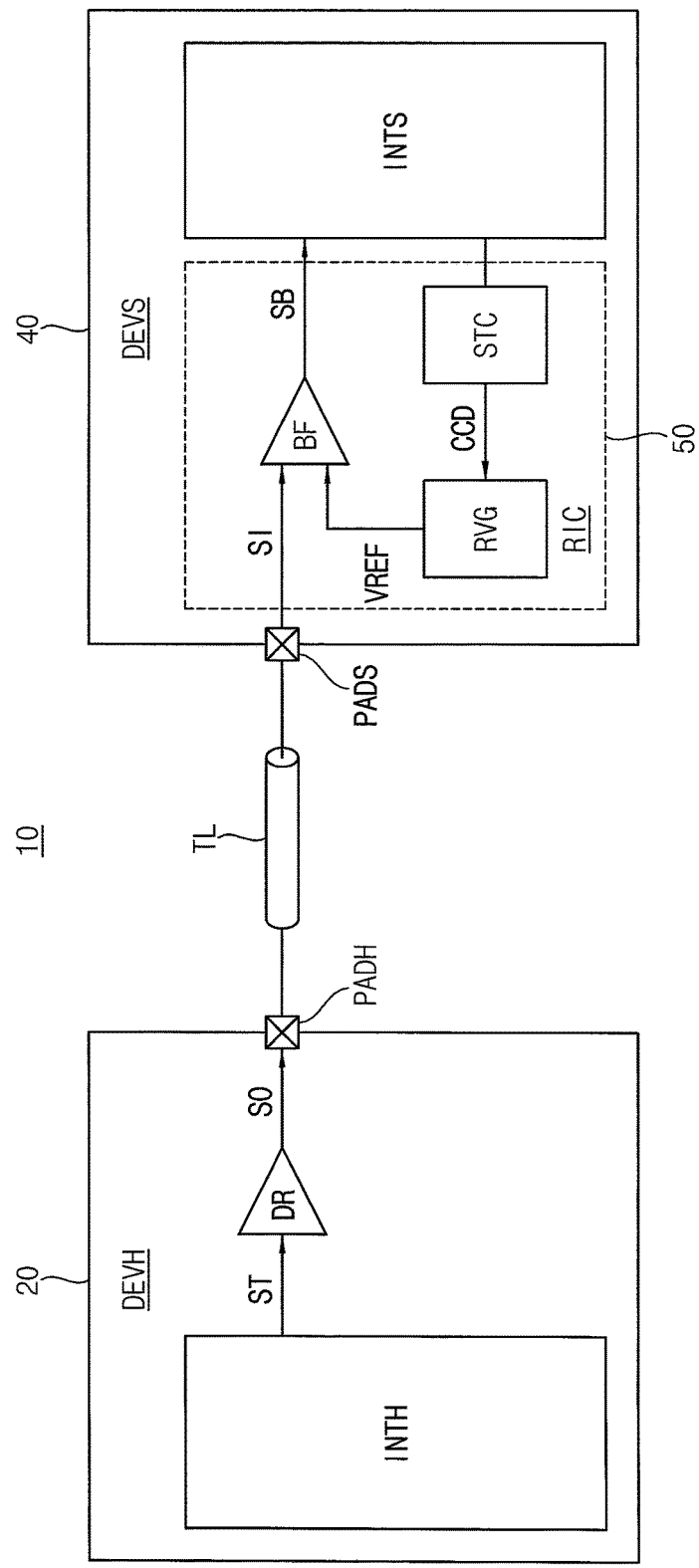
FIG. 1 is a block diagram illustrating a system including a reception interface circuit according to example embodiments.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, like numbers refer to like elements throughout. Though the different figures show variations of exemplary embodiments, and may be referred to using language such as "in one embodiment," these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

As is traditional in the field of the disclosed technology, features and embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

Figure 2:
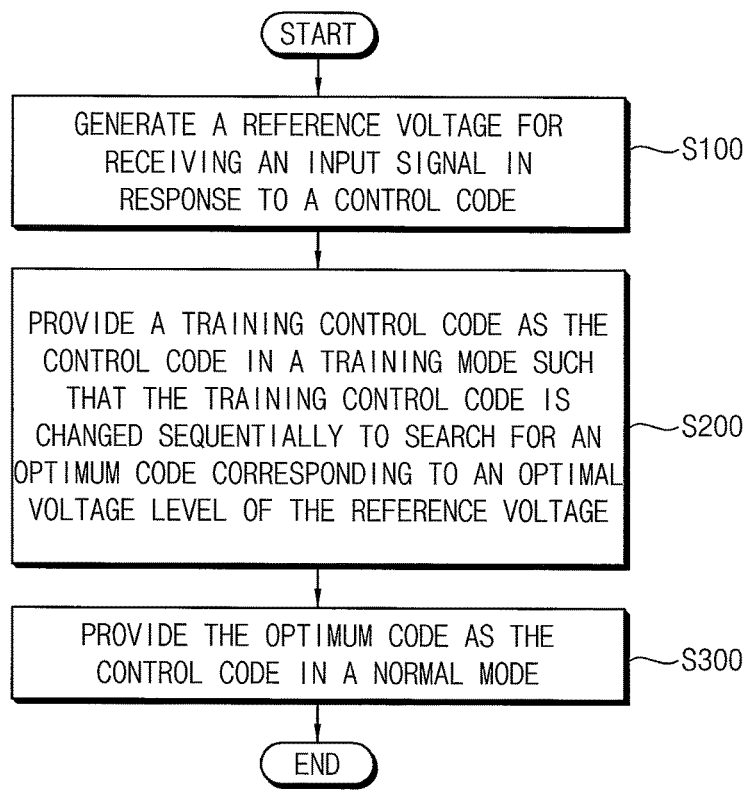
FIG. 2 is a flow chart illustrating a method of self-training of a reference voltage according to example embodiments.

FIG. 1 is a block diagram illustrating a system including a reception interface circuit according to example embodiments, and FIG. 2 is a flow chart illustrating a method of self-training of a reference voltage according to example embodiments.

Referring to FIG. 1, a system 10 includes a first device DEVH 20, a second device DEVS 40 and a transmission line TL connecting the first device 20 and the second device 40. For example the first device 20 may be a memory controller and the second device 40 may be a memory device (e.g., a semiconductor memory chip or package that includes a memory cell array). FIG. 1 illustrates only components for unidirectional communication for convenience of illustration such that the first device 20 functions as a transmitter and the second device 40 functions as a receiver, but each of the first device 20 and the second device 40 may perform bidirectional communication. Even though one pair of input-output pads PADH and PADS and the one transmission line TL connecting the input-output pads PADH and PADS are illustrated in FIG. 1 for convenience of illustration, each of the first device 20 and the second device 40 may include a plurality of input-output pads and a plurality of transmission lines connecting between respective pairs of input-output pads.

A transmission driver DR in the first device 20 may output an output signal SO to the input-output pad PADH based on a transmission signal ST from an internal circuit INTH. A reception interface circuit 50 in the second device 40 may compare an input signal SI received through the input-output pad PADS with a reference voltage VREF and provide a buffer signal SB to an internal circuit INTS.

As illustrated in FIG. 1, the reception interface circuit 50 may have a configuration for single-ended signaling or pseudo-differential signaling. In fully-differential signaling, the transmitter transmits a transmission signal and its inversion signal and the receiver compares the two signals for determining a logic high level of a logic low level of the transmission signal. In contrast, in pseudo-differential signaling, the transmitter transmits only the transmission signal and the receiver compares the transmission signal with the reference voltage for determining the logic high level and the logic low level of the transmission signal.

Referring to FIGS. 1 and 2, the reception interface circuit 50 may include a reception buffer BF, a reference voltage generator RVG and a self-training circuit STC. Each of these components may be composed of a circuit including a plurality of circuit components, such as transistors, resistors, latches, etc., some of which are described in greater detail below. The reception buffer BF may compare the input signal SI with the reference voltage VREF to generate a buffer signal SB, also described as a buffer output or buffer output signal. The reference voltage generator RVG may generate the reference voltage VREF in response to a control code CCD (S100). The generation of the reference voltage VREF may be implemented variously and one example will be described below with reference to FIG. 4. The self-training circuit STC may output a training control code SCD as the control code CCD in a training mode such that the training control code SCD is changed sequentially to search for an optimum code corresponding to an optimal voltage level of the reference voltage VREF (S200). The sequential change of the training control code SCD will be described below with reference to FIGS. 5, 6 and 7. In addition, the self-training circuit STC may output the optimum code OCD as the control code CCD in a normal mode (S300). The control code used in the normal mode is also described herein as an operational control code.

In external training of conventional memory systems, the memory controller controls overall training processes of the memory device. The memory controller transfers a command for setting the reference voltage to a particular value and then the reception operation of the memory device is verified through write and read operations. The memory controller repeats the verification with changing the reference voltage to determine the optimal reference voltage. Such external training requires about 1 ms (millisecond) per memory chip and degrades performance of the memory system. For example, a NAND flash memory device of high capacity may include a plurality of memory chips in a single package. In this case, the training time is increased in proportion to the number of the memory chips and the external training is not suitable for the high-capacity memory device.

The reception interface circuit 50 according to example embodiments may reduce the training time by searching for the optimal reference voltage using the self-training circuit STC included in the reception interface circuit 50. In a multi-chip package including a plurality of semiconductor chips, the training time may be reduced significantly by simultaneously searching for the optimal reference voltages of the respective semiconductor chips, for example through different input-output pads.

In some example embodiments, as will be described below with reference to FIGS. 3 through 8, the reception interface circuit 50 may receive the input signal SI of a high voltage level or a low voltage level in the training mode to search for the optimum code OCD. In other example embodiments, as will be described below with reference to FIGS. 13, 14 and 15, the reception interface circuit 50 may receive the input signal SI toggling between the high voltage level and the low voltage level in the training mode to search for the optimum code OCD. As such, the reception interface circuit 50 according to example embodiments may provide the optimal reference voltage regardless of system configurations and operational conditions by searching for the optimal reference voltage based on the input signal transferred from the transmitter, and thus performance of a system including the reception interface circuit, may be enhanced.

Figure 3:
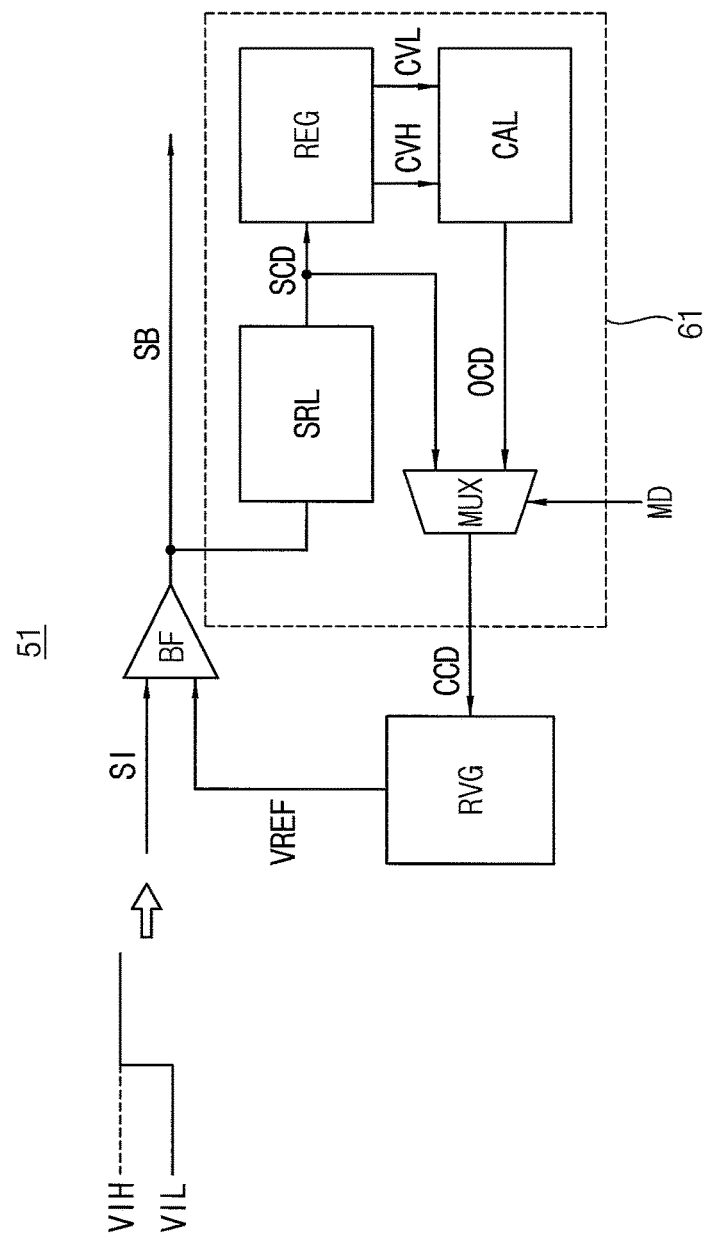
FIG. 3 is a diagram illustrating a reception interface circuit according to example embodiments.

FIG. 3 is a diagram illustrating a reception interface circuit according to example embodiments.

Referring to FIG. 3, a reception interface circuit 51 may include a reception buffer BF, a reference voltage generator RVG and a self-training circuit 61. The reception buffer BF may compare an input signal SI with a reference voltage VREF to generate a buffer signal SB. The reference voltage generator RVG may generate the reference voltage VREF in response to a control code CCD.

As described above, the self-training circuit 61 may output a training control code SCD as the control code CCD in a training mode such that the training control code SCD is changed sequentially to search for an optimum code OCD corresponding to an optimal voltage level of the reference voltage VREF and output the optimum code OCD as the control code CCD in a normal mode. To provide the control code CCD, the self-training circuit 61 may include a search logic SRL, a register REG, a calculator CAL and a selector MUX.

The search logic SRL may generate the training control code SCD that is changed (e.g., sequentially in some implementations) in the training mode and search for a code value of the training control code SCD corresponding to a minimum difference between the reference voltage VREF and a voltage level of the input signal SI based on the buffer signal SB output from the reception buffer BF. When the input signal SI has the high voltage level VIH, the search logic SRL may search for a high code value CVH corresponding to a minimum difference between the reference voltage VREF and the high voltage level VIH of the input signal SI. In contrast, when the input signal SI has the low voltage level VIL, the search logic SRL may search for a low code value CVL corresponding to a minimum difference between the reference voltage VREF and the low voltage level VIL of the input signal SI. The operation of the search logic SRL will be further described below with reference to FIGS. 5, 6 and 7.

The register REG may store the code value from the search logic SRL. The calculator CAL may calculate the optimum code OCD based on the stored value in the register REG. For example, in some embodiments, the register REG may store the high code value CVH corresponding to the high voltage level VIH of the input signal SI and the low code value CVL corresponding to the low voltage level VIL of the input signal SI. In some example embodiments, the search logic SRL may search for the high code value CVH and the low code value CVL sequentially and store the searched high code value CVH and the searched low code value CVL in the register REG. In other example embodiments, the search logic SRL may search for only one of the high code value CVH and the low code value CVL to store the searched one in the register REG and a default value, for example, a predetermined value may be stored in the register REG as the other of the high code value CVH and the low code value CVL.

The calculator CAL may, based on the high code value CVH and the low code value CVL, calculate the optimum code OCD so that the a difference between an average value of the high voltage level VIH and the low voltage level VIL and the reference voltage VREF corresponding to the optimum code OCD may be minimized. The operation of the calculator CAL will be further described below with reference to FIGS. 9A through 12B.

The selector MUX, also described as a selecting circuit, may select one of the training control code SCD from the search logic SRL and the optimum code OCD from the calculator CAL in response to a mode signal MD to output the selected one as the control code CCD. The selector MUX may output the training control code SCD in the training mode and the optimum code OCD as an operational control code in the normal mode.

Even though not illustrated in FIG. 3, the search logic SRL may be enabled only in the training mode and disabled in the normal mode in response to the mode signal MD. The mode signal MD may be provided from the internal circuit INTS in FIG. 1 and the logic level of the mode signal MD may indicate the training mode or the normal mode. The selector MUX may output the training control code SCD from the search logic SRL in the training mode. As a result, the reception buffer BF, the search logic SRL, the selector MUX and the reference voltage generator RVG may form a training loop in the training mode. Using the training loop, the optimum code OCD corresponding to the optimal reference voltage VREF may be searched for rapidly.

Figure 4:
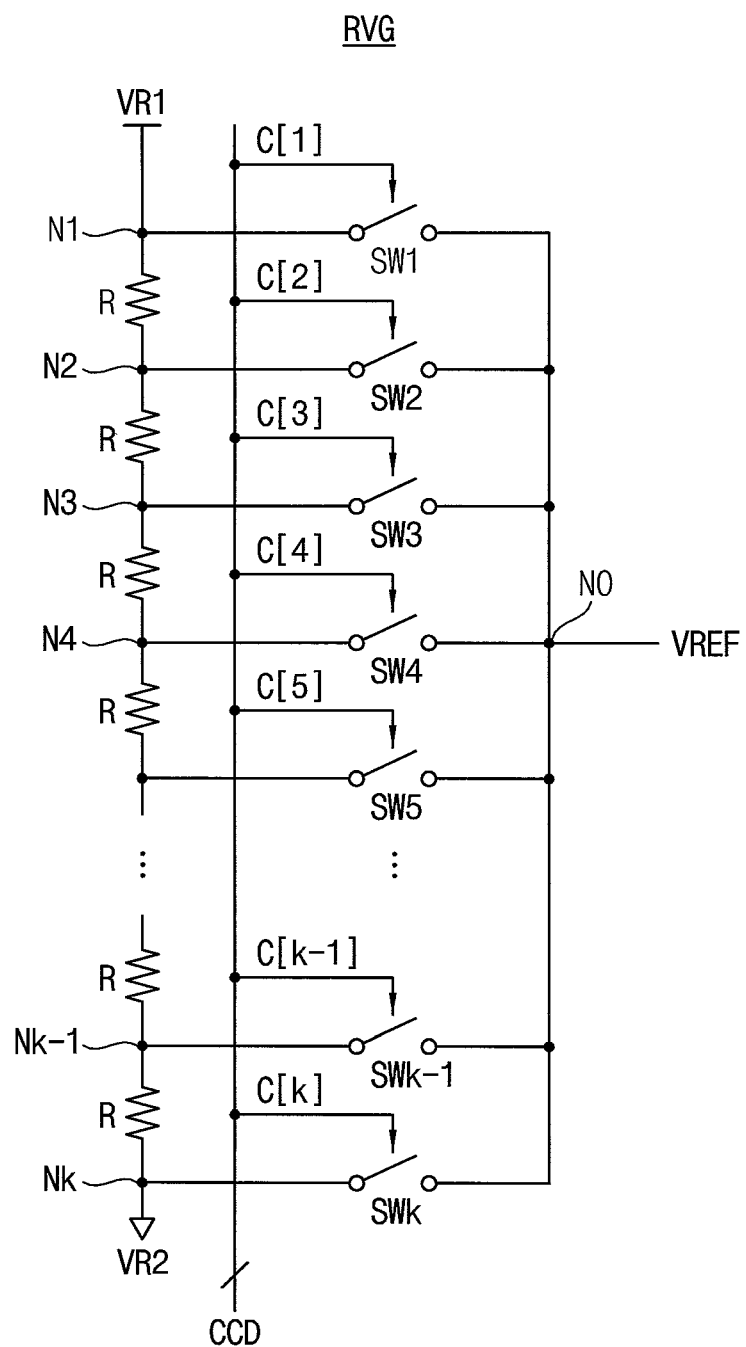
FIG. 4 is a diagram illustrating an example of a reference voltage generator included in the reception interface circuit of FIG. 3.

FIG. 4 is a diagram illustrating an example of a reference voltage generator included in the reception interface circuit of FIG. 3.

FIG. 4 illustrates a reference voltage generator RVG of a resistance division scheme. The configuration of FIG. 4 is a non-limiting example for describing a relation between the control code CCD and the reference voltage VREF and the reference voltage generator RVG may be implemented with an arbitrary digital-to-analog converter (DAC) of various configurations.

Figure 5:
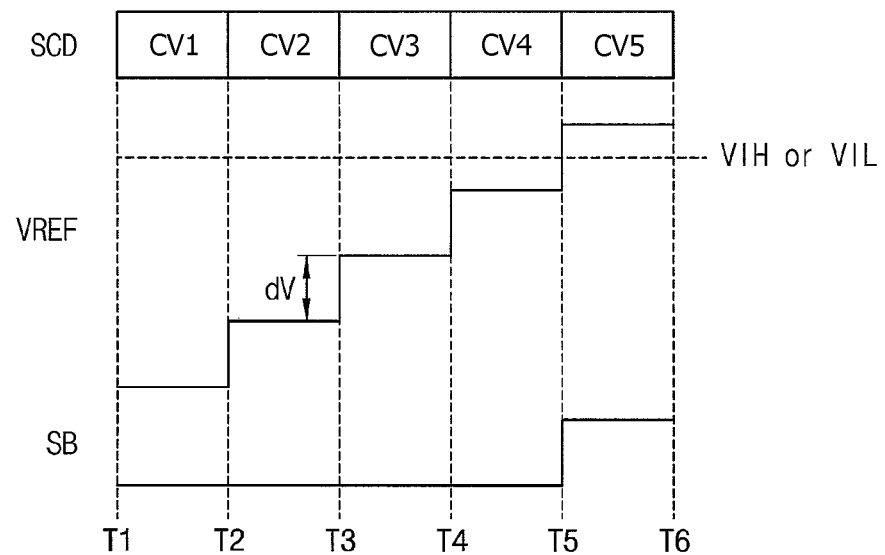
FIGS. 5, 6 and 7 are diagrams for describing example embodiments of code search by a reception interface circuit in a training mode.

Referring to FIG. 4, the reference voltage generator RVG may include a plurality of division resistors R and a plurality of switches SW1~SWk. The division resistors R may be connected in series between a first division node N1 and a k-th division node Nk. A first voltage VR1 may be applied to the first division node N1 and a second voltage VR2 lower than the first voltage VR1 may be applied to the k-th node Nk. For example, the first voltage VR1 may be a power supply voltage and the second voltage VR2 may be a ground voltage. The switches SW1~SWk may be connected in parallel between the division nodes N1~Nk and an output node NO. The switches SW1~SWk may control electrical connections between the division nodes N1~Nk and the output node NO in response to code bits C[1]~C[k] of the control code CCD, respectively. For example, in some embodiments, only one of the code bits C[1]~C[k] may be activated at one time as a thermometer code and the switch corresponding to the activated code bit may be turned on to provide the voltage of the corresponding division node to the output node NO as the reference voltage VREF. For example, the above-mentioned sequential change of the training control code SCD may be performed by selectively activating the code bits C[1]~C[k]. The code bits C[1]~C[k] may be activated sequentially one by one in the direction from the k-th code bit [Ck] to the first code bit C[1] so that the reference voltage VREF increasing stepwise may be provided as illustrated in FIG. 5. In contrast, the code bits C[1]~C[k] may be activated sequentially one by one in the direction from the first code bit [C1] to the k-th code bit C[k] so that the reference voltage VREF decreasing stepwise may be provided as illustrated in FIG. 6.

By generating an output voltage based on a control code, a first voltage such as a power voltage, and a second voltage such as a ground voltage, the reference voltage generator provides a selected voltage to the reception buffer.

Figure 6:
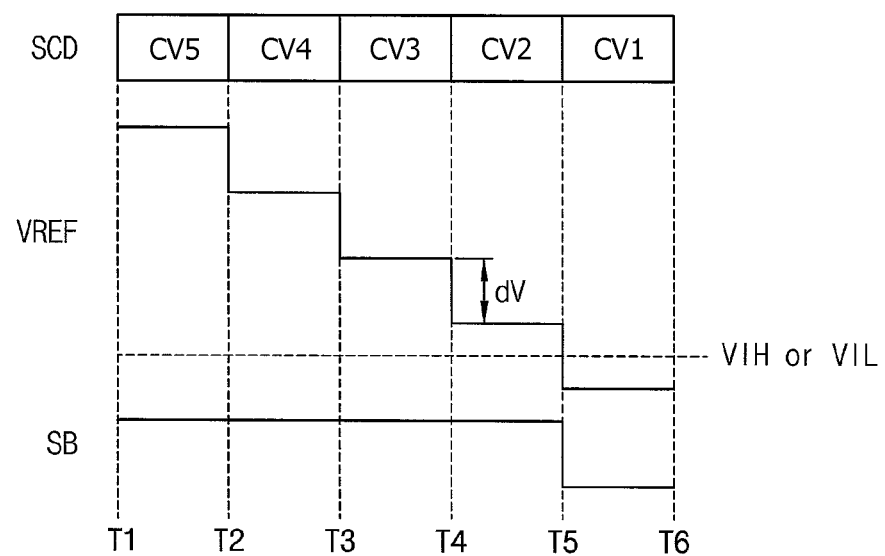
Figure 7:
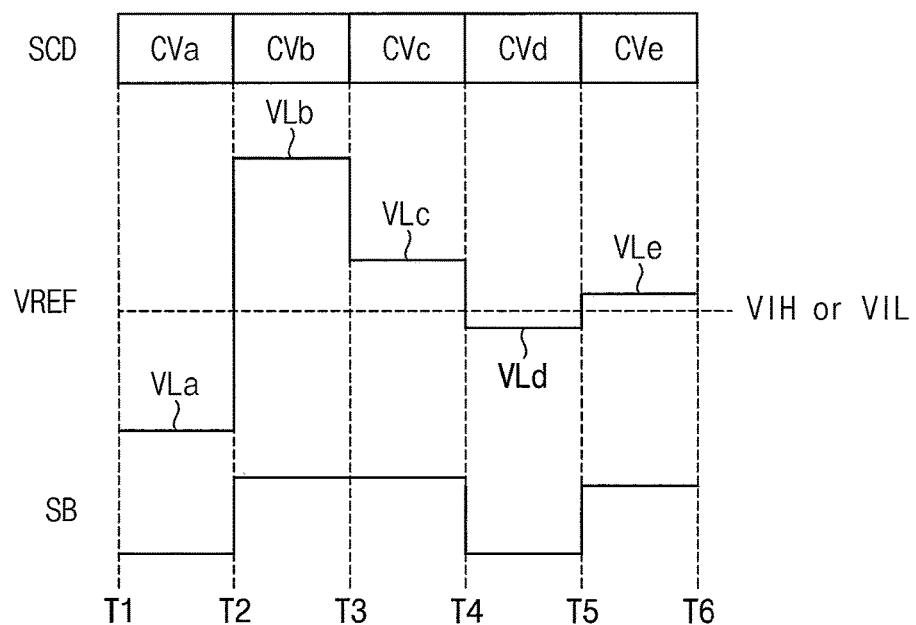

FIGS. 5, 6 and 7 are diagrams for describing example embodiments of code search by a reception interface circuit in a training mode. FIGS. 5 and 6 illustrate the code search of a linear scheme and FIG. 7 illustrates the code search of successive approximation scheme.

Referring to FIGS. 3 and 5, the search logic SRL may change the code value of the training control code SCD sequentially at each of time points T1~T6 in the training mode, and the reference voltage generator RVG may receive the training control code SCD as the control code CCD. As described with reference to FIG. 4, the search logic SRL may provide the code values CV1~CV5 sequentially so that the reference voltage VREF may be increased stepwise. The buffer signal SB from the reception buffer BF may have the logic low level when the voltage level VIH or VIL of the input signal SI is lower than the reference voltage VREF and have the logic high level when the voltage level VIH or VIL of the input signal SI is higher than the reference voltage VREF. Based on such level transition of the buffer signal SB, the search logic SRL may search for the code value of the training control code SCD corresponding the minimum difference between the voltage level VIH or VIL of the input signal SI and the reference voltage VREF. Because of the minimum gap dV of the reference voltage VREF that the reference voltage generator RVG may generate, it may be impossible to provide the code value corresponding to the reference voltage VREF exactly equal to the voltage level VIH or VIL of the input signal SI. In this case, the search logic SRL may select one as the code value corresponding to the voltage level VIH or VIL of the input signal SI among the two code values CV4 and CV5 before and after time point T5 when the level transition of the buffer signal SB occurs. For example either the value (CV4) before the transition or the value (CV5) after the transition can be selected.

Referring to FIGS. 3 and 6, the search logic SRL may change the code value of the training control code SCD sequentially at each of time points T1~T6 in the training mode, and the reference voltage generator RVG may receive the training control code SCD as the control code CCD. As described with reference to FIG. 4, the search logic SRL may provide the code values CV5~CV1 sequentially so that the reference voltage VREF may be decreased stepwise. The buffer signal SB from the reception buffer BF may have the logic high level when the voltage level VIH or VIL of the input signal SI is higher than the reference voltage VREF and have the logic low level when the voltage level VIH or VIL of the input signal SI is lower than the reference voltage VREF. Based on such level transition of the buffer signal SB, the search logic SRL may search for the code value of the training control code SCD corresponding the minimum difference between the voltage level VIH or VIL of the input signal SI and the reference voltage VREF. Because of the minimum gap dV of the reference voltage VREF that the reference voltage generator RVG may generate, it may be impossible to provide the code value corresponding to the reference voltage VREF exactly equal to the voltage level VIH or VIL of the input signal SI. In this case, the search logic SRL may select one as the code value corresponding to the voltage level VIH or VIL of the input signal SI among the two code values CV2 and CV1 before and after time point T5 when the level transition of the buffer signal SB occurs. For example either the value (CV2) before the transition or the value (CV1) after the transition can be selected.

Referring to FIGS. 3 and 7, the search logic SRL may change the code value of the training control code SCD sequentially at each of time points T1~T6 in the training mode, and the reference voltage generator RVG may receive the training control code SCD as the control code CCD. FIG. 7 illustrates first through fifth voltage levels VLa~VLe corresponding to first through fifth code values CVa~CVe, respectively. The buffer signal SB from the reception buffer BF may have the logic high level when the voltage level VIH or VIL of the input signal SI is higher than the reference voltage VREF and have the logic low level when the voltage level VIH or VIL of the input signal SI is lower than the reference voltage VREF. Based on such level transition of the buffer signal SB, the search logic SRL may search for the code value of the training control code SCD corresponding the minimum difference between the voltage level VIH or VIL of the input signal SI and the reference voltage VREF.

At time point T2, the search logic SRL may change the training control code SCD from the first code value CVa to the second code value CVb so that the reference voltage VREF may increase from the first voltage level VLa to the second voltage level VLb. The voltage level VIH or VIL is between the first voltage level VLa and the second voltage level VLb because the level transition of the buffer signal SB occurs at time point T2, and thus the search logic SRL may provide the third code value CVc at time point T3 so that the reference voltage VREF may be decreased from the second voltage level VLb to the third voltage level VLc. In contrast, the level transition of the buffer signal SB does not occur at time point T3, it may be determined that the voltage level VIH or VIL of the input signal SI is between the first voltage level VLa and the third voltage level VLc, and thus the search logic SRL may provide the fourth code value CVd at time point T4 so that the reference voltage VREF may be decreased from the third voltage level VLc to the fourth voltage level VLd.

In this way, the search logic SRL may change the code value of the training control code SCD so that the reference voltage VREF may approach the voltage level VIH or VIL of the input signal SI. The search logic SRL may select one as the code value corresponding to the voltage level VIH or VIL of the input signal SI among the last two code values CVd and CVe.

Thus, according to the above discussion, a method of self-training of a reference voltage for a semiconductor device can be performed. The self-training can be performed by the semiconductor device (e.g., a chip or package) itself, for example with only the instruction to begin training and an external input signal being provided from an external device such as a controller or host. In some embodiments, the training is performed during a training mode. The training mode may include a number of iterative steps that occur in a loop manner. For example, a first step may include generating a training reference voltage corresponding to a training control code. The training reference voltage may have a first voltage level and the training control code may have a first value. A second step may include inputting the training reference voltage and an input signal into a reception buffer and based on the training reference voltage and the input signal, outputting a buffer output signal from the reception buffer. A third step may include changing the training control code to have a second value different from the first value, and in response, generating the training reference voltage to have a second voltage level corresponding to the second value. The second and third steps may be repeated for a number ("n") of additional times (e.g., it may be repeated at least twice, or up to at least 5, 10, or 20 times), each time using a different value of the training control code to generate a different training reference voltage level, and each time inputting the training reference voltage and the input signal into the reception buffer. Based on the different voltage levels and their resulting buffer output signals, one of the values of the training control codes can be selected as the value of an operational control code used to generate an operational reference voltage during a normal mode of operation of the semiconductor device. The different values of the training control codes can be stored in a register, and one can be selected from the register to be used to generate the operational reference voltage. The training reference voltage generated in the first step is generated in some embodiments without being based on a reference voltage received from a device external to the semiconductor chip or package performing training.

To perform this method, in some embodiments, a semiconductor device may include at least a first memory chip. The first memory chip may include at least a first buffer connected to receive an input signal and a reference voltage. The first memory chip may also include at least a first reference voltage generator configured to output a reference voltage based on a first control code, and at least a first self-training circuit for determining an operational reference voltage to use during a normal mode of operation of the semiconductor device. An output from the first buffer may be input to the first self-training circuit, the first control code may be output from the first self-training circuit into the first reference voltage generator, and the first buffer, the first self-training circuit, and the first reference voltage generator form a loop.

Figure 8:
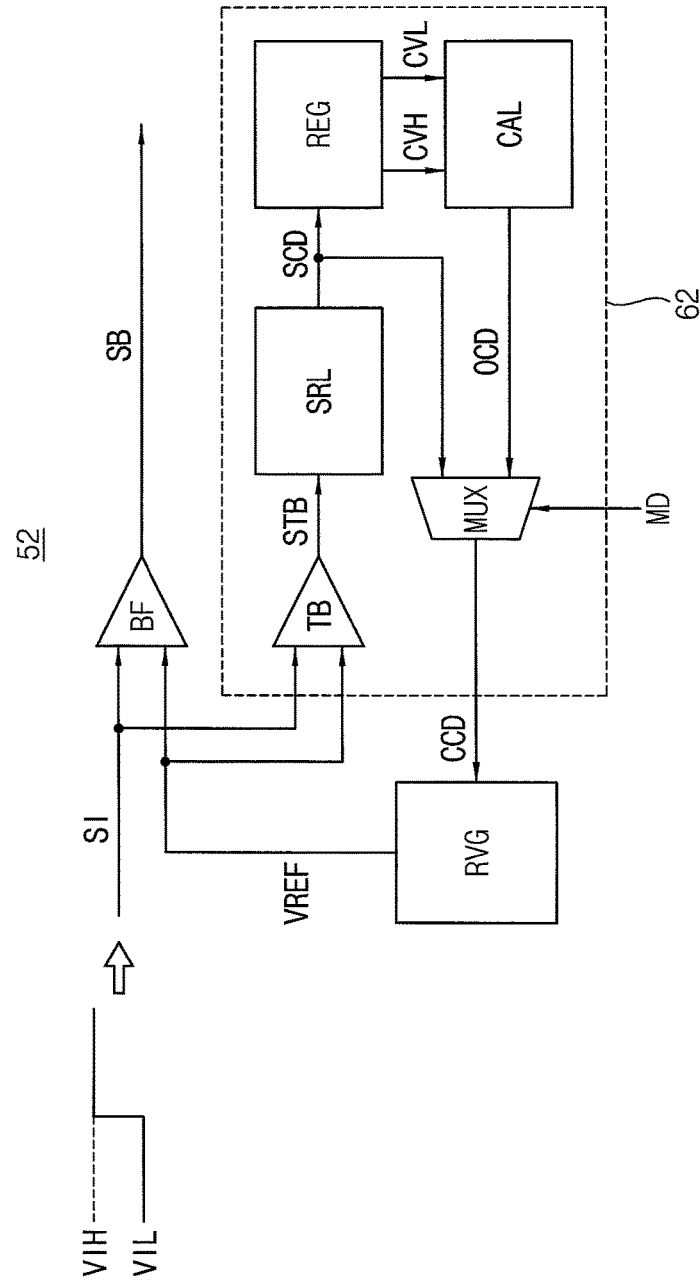
FIG. 8 is a diagram illustrating a reception interface circuit according to example embodiments.

FIG. 8 is a diagram illustrating a reception interface circuit according to example embodiments.

Referring to FIG. 8, a reception interface circuit 52 may include a reception buffer BF, a reference voltage generator RVG and a self-training circuit 62. The reception buffer BF may compare an input signal SI with a reference voltage VREF to generate a buffer signal SB. The reference voltage generator RVG may generate the reference voltage VREF in response to a control code CCD.

As described above, the self-training circuit 62 may output a training control code SCD as the control code CCD in a training mode such that the training control code SCD is changed sequentially to search for an optimum code OCD corresponding to an optimal voltage level of the reference voltage VREF and output the optimum code OCD as the control code CCD in a normal mode. To provide the control code CCD, the self-training circuit 62 may include a training buffer TB, a search logic SRL, a register REG, a calculator CAL and a selector MUX.

The training buffer TB may compare the input signal SI with the reference voltage VREF to generate a training buffer signal STB. The search logic SRL may generate the training control code SCD that is changed sequentially in the training mode and search for a code value of the training control code SCD corresponding to a minimum difference between the reference voltage VREF and a voltage level of the input signal SI based on the training buffer signal STB from the training buffer TB. When the input signal SI has the high voltage level VIH, the search logic SRL may search for a high code value CVH corresponding to a minimum difference between the reference voltage VREF and the high voltage level VIH of the input signal SI. In contrast, when the input signal SI has the low voltage level VIL, the search logic SRL may search for a low code value CVL corresponding to a minimum difference between the reference voltage VREF and the low voltage level VIL of the input signal SI. The operation of the search logic SRL is the same as described with reference to FIGS. 5, 6 and 7.

The register REG may store the code value from the search logic SRL. The calculator CAL may calculate the optimum code OCD based on the stored value in the register REG. The register REG may store the high code value CVH corresponding to the high voltage level VIH of the input signal SI and the low code value CVL corresponding to the low voltage level VIL of the input signal SI. In some example embodiments, the search logic SRL may search for the high code value CVH and the low code value CVL sequentially and store the searched high code value CVH and the searched low code value CVL in the register REG. In other example embodiments, the search logic SRL may search for only one of the high code value CVH and the low code value CVL to store the searched one in the register REG and a default value, that is, a predetermined value may be stored in the register REG as the other of the high code value CVH and the low code value CVL.

The calculator CAL may, based on the high code value CVH and the low code value CVL, calculate the optimum code OCD so that the a difference between an average value of the high voltage level VIH and the low voltage level VIL and the reference voltage VREF corresponding to the optimum code OCD may be minimized. The operation of the calculator CAL will be further described below with reference to FIGS. 9A through 12B.

The selector MUX may select one of the training control code SCD from the search logic SRL and the optimum code OCD from the calculator CAL in response to a mode signal MD to output the selected one as the control code CCD. The selector MUX may output the training control code SCD in the training mode and the optimum code OCD in the normal mode.

Even though not illustrated in FIG. 8, the training buffer TB and the search logic SRL may be enabled only in the training mode and disabled in the normal mode in response to the mode signal MD. The mode signal MD may be provided from the internal circuit INTS in FIG. 1 and the logic level of the mode signal MD may indicate the training mode or the normal mode. The selector MUX may output the training control code SCD from the search logic SRL in the training mode. As a result, the training buffer TB, the search logic SRL, the selector MUX and the reference voltage generator RVG may form a training loop in the training mode. Using the training loop, the optimum code OCD corresponding to the optimal reference voltage VREF may be searched for rapidly.

In comparison with the self-training circuit 61 in FIG. 3, the self-training circuit 62 in FIG. 8 further includes the training buffer TB. A configuration of the training buffer TB may be equal to a configuration of the reception buffer BF so that the training buffer TB has the same operational characteristics as the reception buffer BF. In case of FIG. 3, the code search is performed using the buffer signal SB output from the reception buffer BF. In this case, the reception buffer BF is included in the training loop and thus the optimal reference voltage VREF determined by the training operation may cancel a DC input offset even though the reception buffer BF has the DC input offset. In case of FIG. 8, the reception buffer BF is excluded from the training loop, the training buffer TB is used in the training mode, and thus effects of the self-training circuit 62 on the output impedance of the reception buffer BF may be reduced or prevented in the normal mode.

Figure 9A:
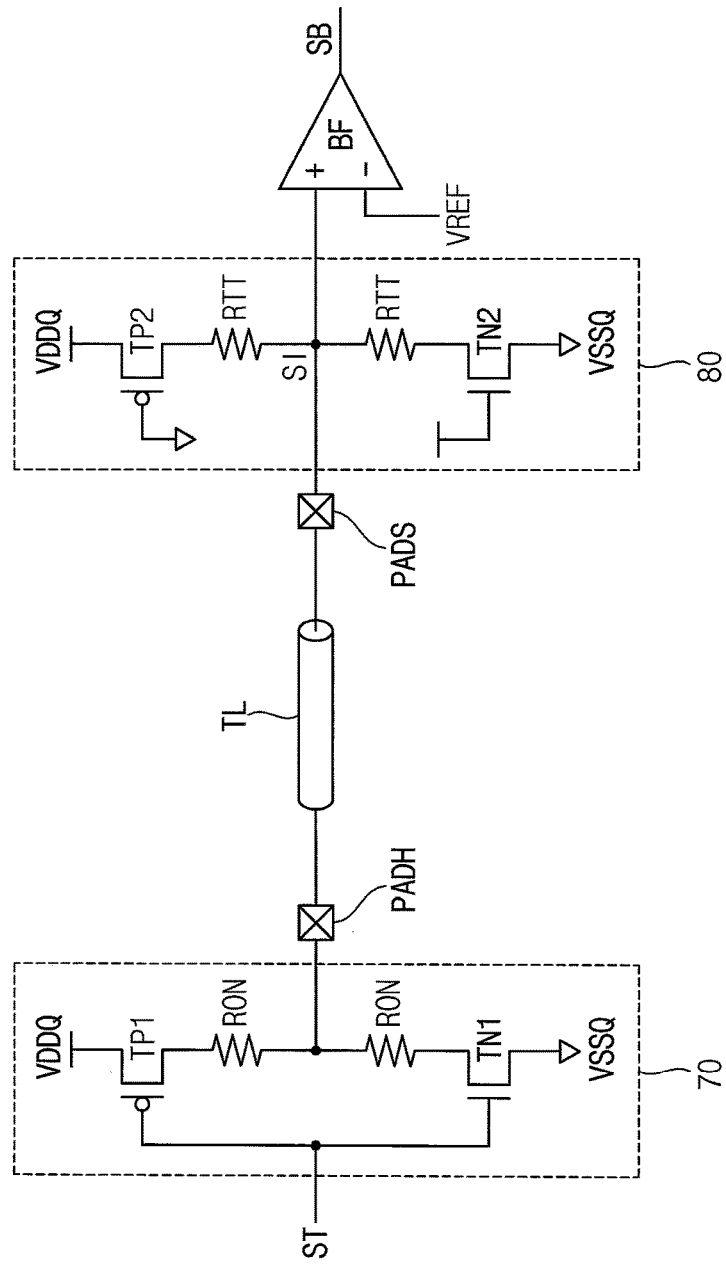
FIGS. 9A and 9B are diagrams for describing a center-tapped termination (CTT).
Figure 9B:
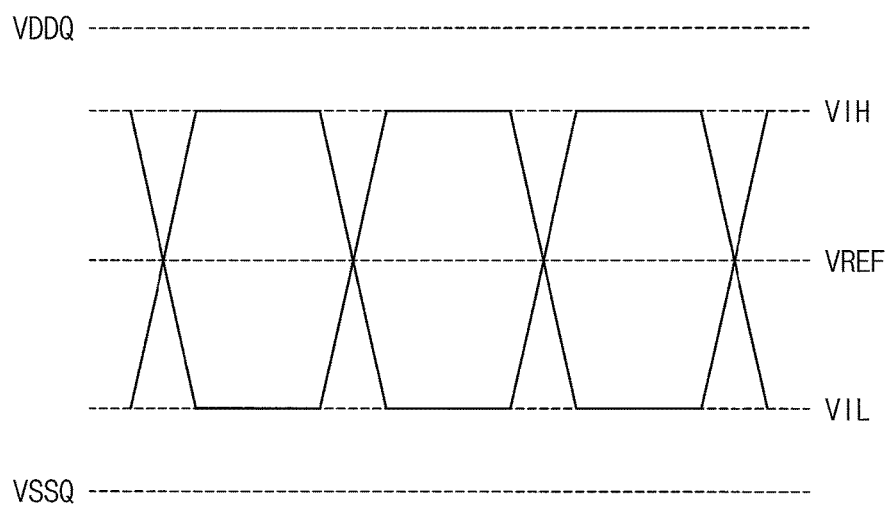

FIGS. 9A and 9B are diagrams for describing a center-tapped termination (CTT).

Referring to FIG. 9A, a transmission driver 70 in a transmitter device may drive an input-output pad PADH based on a transmission signal ST from an internal signal of the transmitter device. The input-output pad PADH of the transmitter device may be connected to an input-output pad PADS of a receiver device through a transmission line TL. A termination circuit 80 of the CTT scheme may be connected to the input-output pad PADS of the receiver device for impedance matching. The reception buffer BF in the receiver device may compare the input signal SI through the input-output pad PADS with the reference voltage VREF to provide the buffer signal SB to an internal circuit of the receiver device.

The transmission driver 70 may include a pull-up unit connected between a first power supply voltage VDDQ and the input-output pad PADH and a pull-down unit connected between the input-output pad PADH and a second power supply voltage VSSQ lower than the first power supply voltage VDDQ. The pull-up unit may include a turn-on resistor RON and a p-channel metal oxide semiconductor (PMOS) transistor TP1 that is switched in response to the transmission signal ST. The pull-down unit may include a turn-on resistor RON and a n-channel metal oxide semiconductor (NMOS) transistor TN1 that is switched in response to the transmission signal ST. The turn-on resistors RON may be omitted and each turn-on resistor RON may represent a resistance between the voltage node and the input-output pad PADH when each of the transistors TP1 and TN1 is turned on. Even though the transmission driver 70 of the pull up and down scheme, the transmission driver may be implemented variously.

The termination circuit 80 of the CTT scheme may include a first sub termination circuit connected between the first power supply voltage VDDQ and the input-output pad PADS and a second sub termination circuit connected between the input-output pad PADS and the second power supply voltage VSSQ. The first sub termination circuit may include a termination resistor RTT and a PMOS transistor TP2 that is turned on in response to a low voltage. The second sub termination circuit may include a termination resistor RTT and an NMOS transistor TN2 that is turned on in response to a high voltage. The termination resistors RTT may be omitted and each termination resistor RTT may represent a resistance between the voltage node and the input-output pad PADS when each of the transistors TP2 and TN2 is turned on.

In case of the termination circuit 80 of the CTT scheme in FIG. 9A, the high voltage level VIH and the low voltage level VIL of the input signal SI may be represented as FIG. 9B. The second power supply voltage VSSQ may be assumed to be a ground voltage (i.e., VSSQ=0) and the voltage drop along the transmission line TL, etc. Thus the high voltage level VIH, the low voltage level VIL and the optimal reference voltage VREF may be calculated as Expression1.

$$VIH = VDDQ*(RON+RTT)/(2RON+RTT),$$

$$VIL = VDDQ*RON/(2RON+RTT),$$

$$VREF = (VIH+VIL)/2 = VDDQ/2 \qquad \text{Expression1}$$

Theoretically the optimal reference voltage VREF may be determined by the first power supply voltage VDDQ as represented by Expression1. However, variations of semiconductor manufacturing processes may cause a mismatch of the turn-on resistors RON between the pull-up unit and the pull-down unit and a mismatch of the termination resistors RTT between the first sub termination circuit and the second sub termination circuit. Accordingly the real optimal reference voltage VREF may be different from Expression1.

According to example embodiments, the search logic SRL may search for the high code value CVH and the low code value CVL sequentially and store the searched high code value CVH and the searched low code value CVL in the register REG. The calculator CAL may calculate the optimum code OCD corresponding to the optimal reference voltage VREF based on the high code value CVH and the low code value CVL that are stored in the register REG.

Figure 10A:
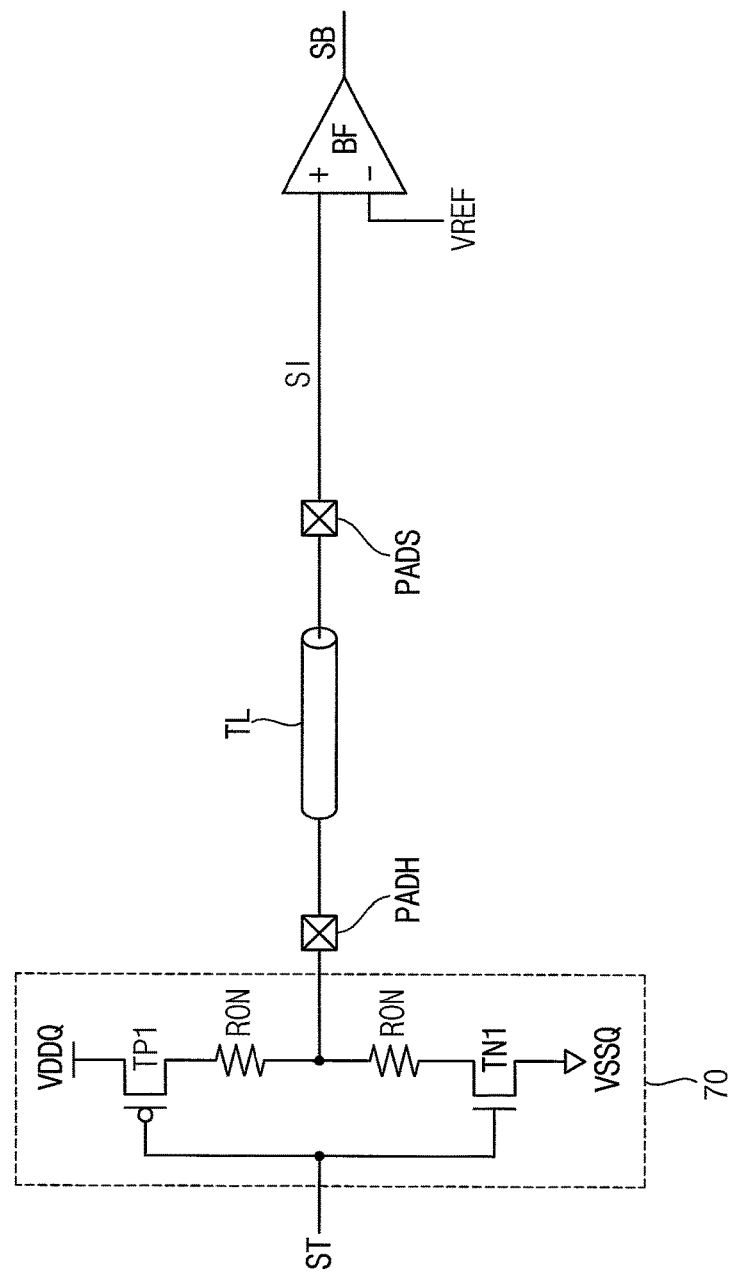
FIGS. 10A and 10B are diagrams for describing an untermination.
Figure 10B:
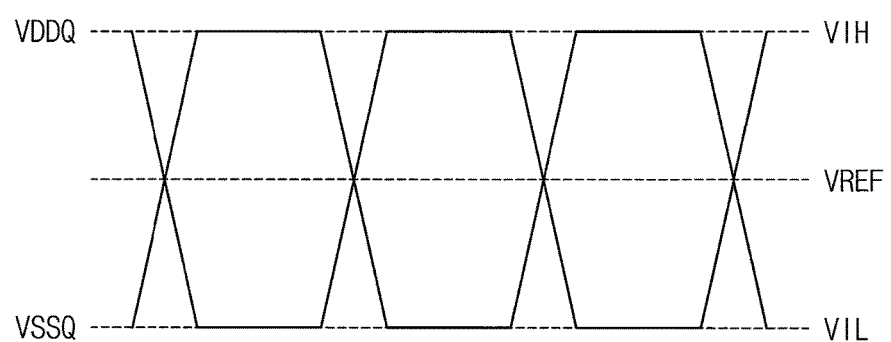

FIGS. 10A and 10B are diagrams for describing an untermination.

Referring to FIG. 10A, a transmission driver 70 in a transmitter device may drive an input-output pad PADH based on a transmission signal ST from an internal signal of the transmitter device. The input-output pad PADH of the transmitter device may be connected to an input-output pad PADS of a receiver device through a transmission line TL. The reception buffer BF in the receiver device may compare the input signal SI through the input-output pad PADS with the reference voltage VREF to provide the buffer signal SB to an internal circuit of the receiver device.

The transmission driver 70 may include a pull-up unit connected between a first power supply voltage VDDQ and the input-output pad PADH and a pull-down unit connected between the input-output pad PADH and a second power supply voltage VSSQ lower than the first power supply voltage VDDQ. The pull-up unit may include a turn-on resistor RON and a PMOS transistor TP1 that is switched in response to the transmission signal ST. The pull-down unit may include a turn-on resistor RON and an NMOS transistor TN1 that is switched in response to the transmission signal ST. The turn-on resistors RON may be omitted and each turn-on resistor RON may represent a resistance between the voltage node and the input-output pad PADH when each of the transistors TP1 and TN1 is turned on.

In case of the untermination in FIG. 10A, the high voltage level VIH and the low voltage level VIL of the input signal SI may be represented as FIG. 10B. The second power supply voltage VSSQ may be assumed to be a ground voltage (i.e., VSSQ=0) and the voltage drop along the transmission line TL, etc. Thus the high voltage level VIH, the low voltage level VIL and the optimal reference voltage VREF may be calculated as Expression2.

$VIH=VDDQ,$ $VIL=VSSQ=0,$ $VREF=(VIH+VIL)/2=VDDQ/2$ Expression2

In comparison with the CTT scheme, the mismatch of the turn-on resistors RON and the mismatch of the termination resistor RTT may not occur in case of the untermination scheme. However, also in this case, a mismatch of the power supply voltages VDDQ and VSSQ between the transmitter device and the receiver device, the voltage drop along the transmission line may be caused. Accordingly the real optimal reference voltage VREF may be different from Expression2.

In some example embodiments, the search logic SRL may search for the high code value CVH and the low code value CVL sequentially and store the searched high code value CVH and the searched low code value CVL in the register REG. In other example embodiments, the search logic SRL may search for only one of the high code value CVH and the low code value CVL to store the searched one (e.g., CVH) in the register REG and a default value, that is, a predetermined value may be stored in the register REG as the other (e.g., CVL) of the high code value CVH and the low code value CVL. For example, the default value may be provided based on the information stored in the mode register set included in the internal circuit of the receiver device. The calculator CAL may calculate the optimum code OCD corresponding to the optimal reference voltage VREF based on the high code value CVH and the low code value CVL that are stored in the register REG.

Figure 11A:
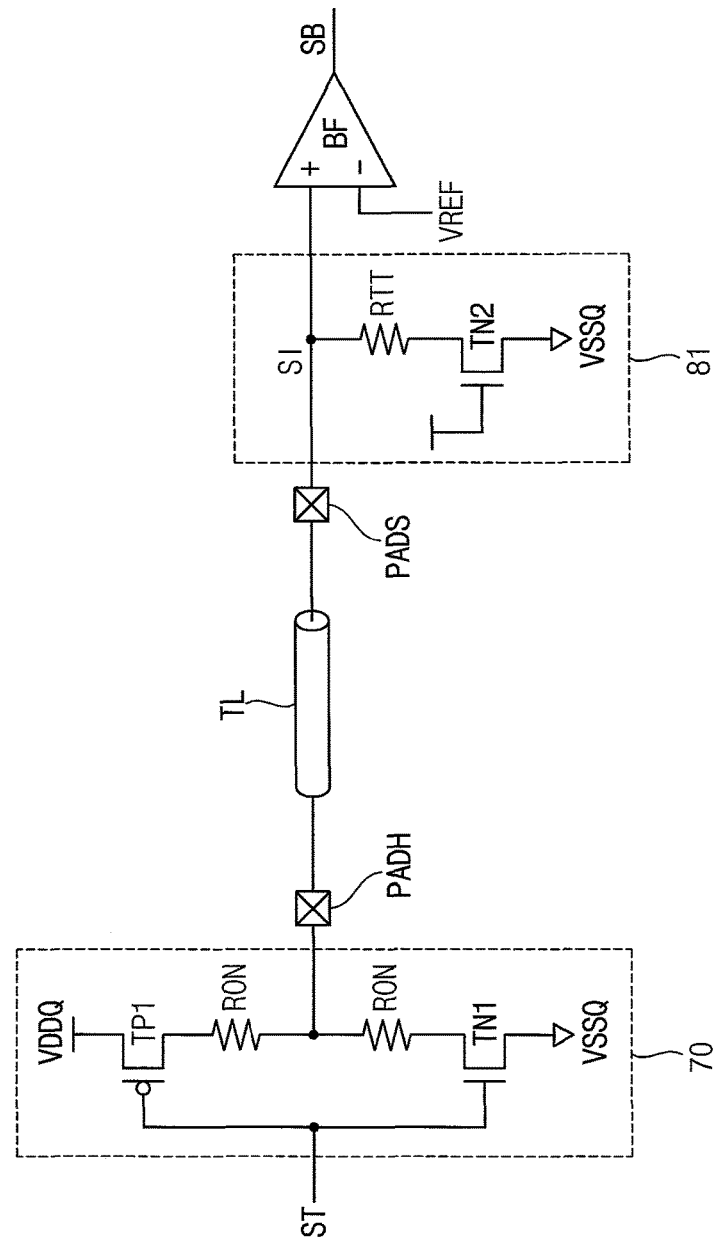
FIGS. 11A and 11B are diagrams for describing a first pseudo-open drain (POD) termination.
Figure 11B:
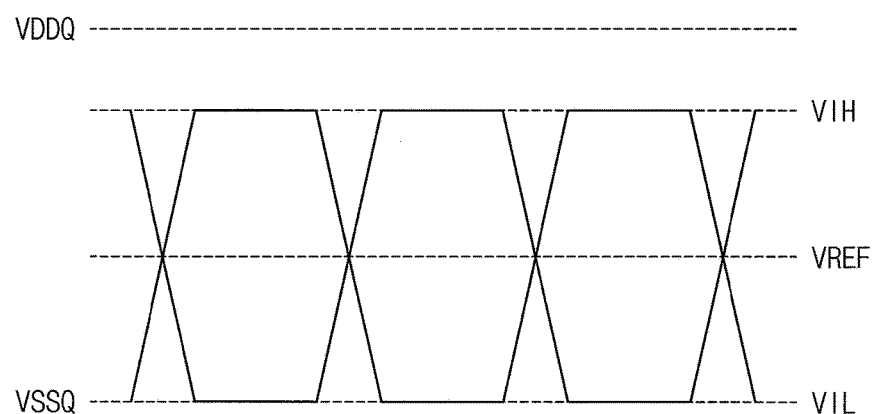

FIGS. 11A and 11B are diagrams for describing a first pseudo-open drain (POD) termination.

Referring to FIG. 11A, a transmission driver 70 in a transmitter device may drive an input-output pad PADH based on a transmission signal ST from an internal signal of the transmitter device. The input-output pad PADH of the transmitter device may be connected to an input-output pad PADS of a receiver device through a transmission line TL. A termination circuit 81 of the first POD termination scheme may be connected to the input-output pad PADS of the receiver device for impedance matching. The reception buffer BF in the receiver device may compare the input signal SI through the input-output pad PADS with the reference voltage VREF to provide the buffer signal SB to an internal circuit of the receiver device.

The transmission driver 70 may include a pull-up unit connected between a first power supply voltage VDDQ and the input-output pad PADH and a pull-down unit connected between the input-output pad PADH and a second power supply voltage VSSQ lower than the first power supply voltage VDDQ. The pull-up unit may include a turn-on resistor RON and a PMOS transistor TP1 that is switched in response to the transmission signal ST. The pull-down unit may include a turn-on resistor RON and an NMOS transistor TN1 that is switched in response to the transmission signal ST. The turn-on resistors RON may be omitted and each turn-on resistor RON may represent a resistance between the voltage node and the input-output pad PADH when each of the transistors TP1 and TN1 is turned on.

The termination circuit 81 of the first POD termination scheme may include a termination resistor RTT and an NMOS transistor TN2 that is turned on in response to a high voltage. The termination resistor RTT may be omitted and the termination resistor RTT may represent a resistance between the voltage node and the input-output pad PADS when the NMOS transistor TN2 is turned on.

In case of the termination circuit 81 of the first POD termination scheme in FIG. 11A, the high voltage level VIH and the low voltage level VIL of the input signal SI may be represented as FIG. 11B. The second power supply voltage VSSQ may be assumed to be a ground voltage (i.e., VSSQ=0) and the voltage drop along the transmission line TL, etc. Thus the high voltage level VIH, the low voltage level VIL and the optimal reference voltage VREF may be calculated as Expression3.

$VIH=VDDQ*RTT/(RON+RTT),$ $VIL=VSSQ=O,$ $VREF=(VIH+VIL)/2=VDDQ*RTT/2(RON+RTT)$ Expression3

As known from Expression3, the optimal reference voltage VREF may be determined by a resistance ratio between the turn-on resistor RON and the termination resistor RTT. In this case, the optimal reference voltage VREF is not fixed, for example, it is variable and the training operation for the optimal reference voltage VREF may be indispensable.

In some example embodiments, the search logic SRL may search for the high code value CVH and the low code value CVL sequentially and store the searched high code value CVH and the searched low code value CVL in the register REG. In other example embodiments, the search logic SRL may search for only the high code value CVH corresponding to the high voltage level VIH of the input signal SI to store the searched high code value CVH in the register REG and a default value, that is, a predetermined value may be stored in the register REG as the low code value CVL. For example, the default value may be provided based on the information stored in the mode register set included in the internal circuit of the receiver device. The calculator CAL may calculate the optimum code OCD corresponding to the optimal reference voltage VREF based on the high code value CVH and the low code value CVL that are stored in the register REG.

Figure 12A:
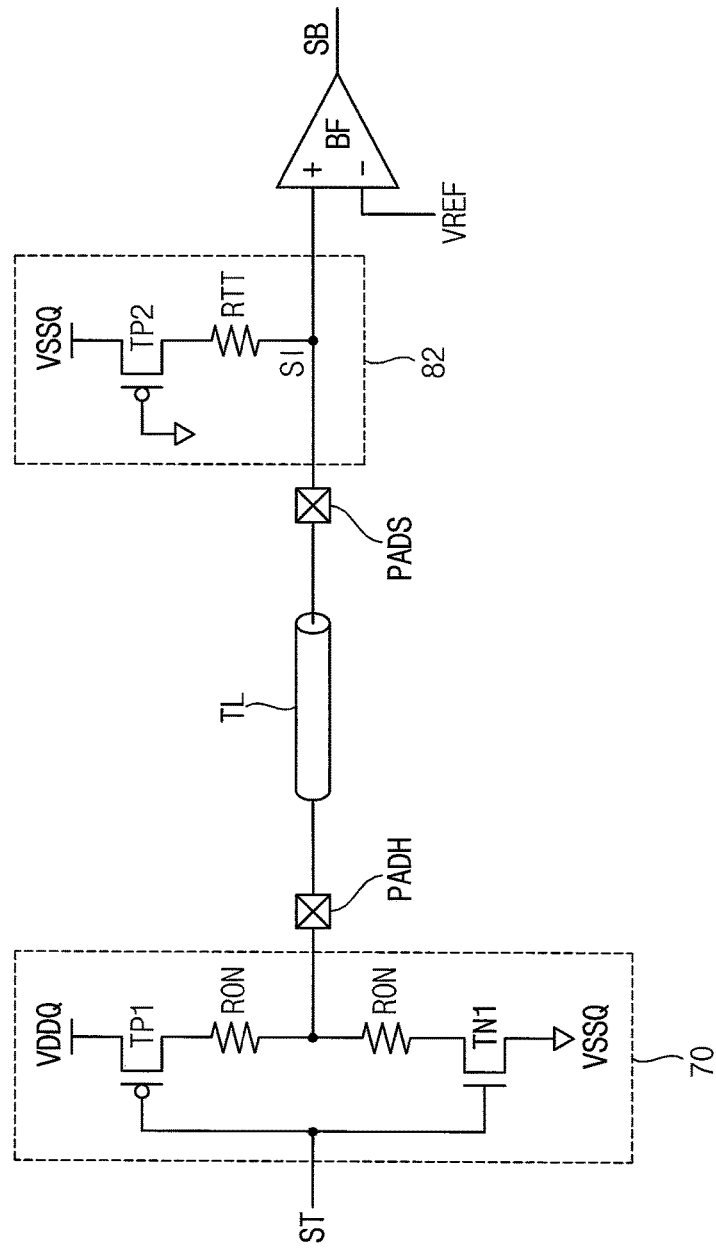
FIGS. 12A and 12B are diagrams for describing a second POD termination.
Figure 12B:
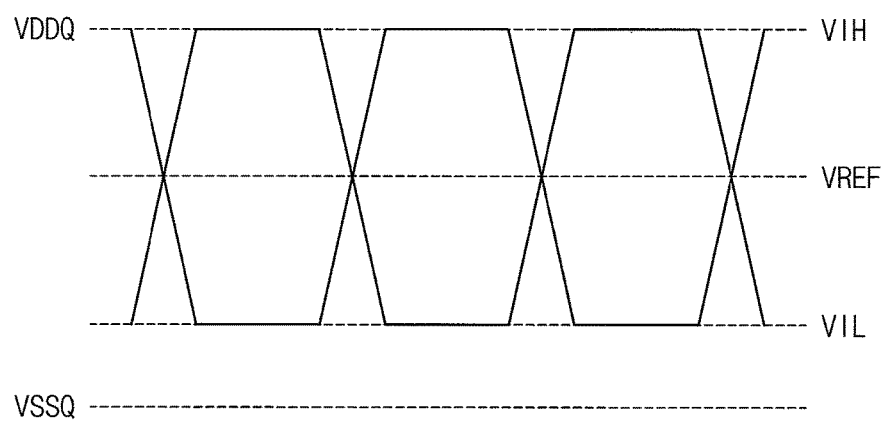

FIGS. 12A and 12B are diagrams for describing a second POD termination.

Referring to FIG. 12A, a transmission driver 70 in a transmitter device may drive an input-output pad PADH based on a transmission signal ST from an internal signal of the transmitter device. The input-output pad PADH of the transmitter device may be connected to an input-output pad PADS of a receiver device through a transmission line TL. A termination circuit 82 of the second POD termination scheme may be connected to the input-output pad PADS of the receiver device for impedance matching. The reception buffer BF in the receiver device may compare the input signal SI through the input-output pad PADS with the reference voltage VREF to provide the buffer signal SB to an internal circuit of the receiver device.

The transmission driver 70 may include a pull-up unit connected between a first power supply voltage VDDQ and the input-output pad PADH and a pull-down unit connected between the input-output pad PADH and a second power supply voltage VSSQ lower than the first power supply voltage VDDQ. The pull-up unit may include a turn-on resistor RON and a PMOS transistor TP1 that is switched in response to the transmission signal ST. The pull-down unit may include a turn-on resistor RON and an NMOS transistor TN1 that is switched in response to the transmission signal ST. The turn-on resistors RON may be omitted and each turn-on resistor RON may represent a resistance between the voltage node and the input-output pad PADH when each of the transistors TP1 and TN1 is turned on.

The termination circuit 82 of the second POD termination scheme may include a termination resistor RTT and a PMOS transistor TP2 that is turned on in response to a low voltage. The termination resistor RTT may be omitted and the termination resistor RTT may represent a resistance between the voltage node and the input-output pad PADS when the NMOS transistor TN2 is turned on.

In case of the termination circuit 82 of the first POD termination scheme in FIG. 12A, the high voltage level VIH and the low voltage level VIL of the input signal SI may be represented as FIG. 12B. The second power supply voltage VSSQ may be assumed to be a ground voltage (i.e., VSSQ=0) and the voltage drop along the transmission line TL, etc. Thus the high voltage level VIH, the low voltage level VIL and the optimal reference voltage VREF may be calculated as Expression4.

$$VIH=VDDQ,$$

$$VIL=VDDQ*RON/(RON+RTT),$$

$$VREF=(VIH+VIL)/2=VDDQ*(2RON+RTT)/2(RON+RTT) \quad \text{Expression4}$$

As known from Expression4, the optimal reference voltage VREF may be determined by a resistance ratio between the turn-on resistor RON and the termination resistor RTT. In this case, the optimal reference voltage VREF is not fixed, for example, it is variable and the training operation for the optimal reference voltage VREF may be indispensable.

In some example embodiments, the search logic SRL may search for the high code value CVH and the low code value CVL sequentially and store the searched high code value CVH and the searched low code value CVL in the register REG. In other example embodiments, the search logic SRL may search for only the low code value CVL corresponding to the low voltage level VIL of the input signal SI to store the searched low code value CVL in the register REG and a default value, that is, a predetermined value may be stored in the register REG as the high code value CVH. For example, the default value may be provided based on the information stored in the mode register set included in the internal circuit of the receiver device. The calculator CAL may calculate the optimum code OCD corresponding to the optimal reference voltage VREF based on the high code value CVH and the low code value CVL that are stored in the register REG.

Figure 13:
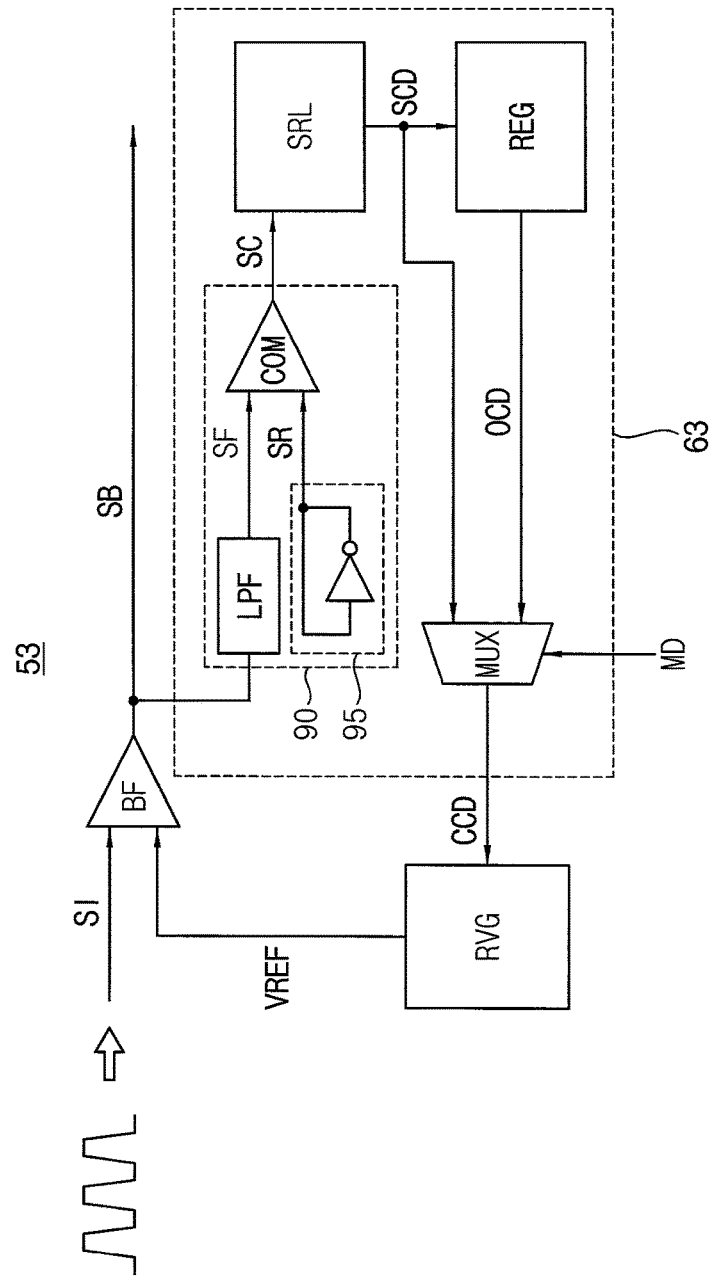
FIG. 13 is a diagram illustrating a reception interface circuit according to example embodiments.

FIG. 13 is a diagram illustrating a reception interface circuit according to example embodiments.

Referring to FIG. 13, a reception interface circuit 53 may include a reception buffer BF, a reference voltage generator RVG and a self-training circuit 63. The reception buffer BF may compare an input signal SI with a reference voltage VREF to generate a buffer signal SB. The reference voltage generator RVG may generate the reference voltage VREF in response to a control code CCD.

As described above, the self-training circuit 63 may output a training control code SCD as the control code CCD in a training mode such that the training control code SCD is changed (e.g., sequentially) to search for an optimum code OCD corresponding to an optimal voltage level of the reference voltage VREF and output the optimum code OCD as the control code CCD (e.g., an operational control code) in a normal mode. To provide the control code CCD, the self-training circuit 63 may include a duty detector 90, a search logic SRL, a register REG and a selector MUX.

The duty detector 90 may compare a duty ratio of the buffer signal SB from the reception buffer BF with a reference duty ratio to generate a comparison signal SC. The duty detector 90 may include a low pass filter LPF, a reference signal generator 95 and a comparator COM. The low pass filter LPF may perform low pass filtering on the buffer signal SB to generate a filter signal SF having a voltage level corresponding to the duty ratio of the buffer signal SB. The reference signal generator 95 may generate a reference signal SR having a voltage level corresponding to the reference duty ratio. For example, the reference signal generator 95 may include an inverter and its input and output are connected. The reference duty ratio may be set by adjusting a size ratio between a PMOS transistor and an NMOS transistor in the inverter. The comparator COM may compare the filter signal SF and the reference signal SR to generate the comparison signal SC having the logic high level or the logic low level.

The search logic SRL may generate the training control code SCD that is changed, for example sequentially, in the training mode and search for a code value of the training control code SCD corresponding to a minimum difference between the duty ratio of the buffer signal SB and the reference duty ratio based on the comparison signal SC from the duty detector 90. When the input signal SI has a form of a clock signal that toggles between the high voltage level VIH and the low voltage level VIL, the buffer signal SB has the duty ratio that changes depending on the reference voltage VREF. For example, the reference duty ratio may be set to 50% and the search logic SRL may search for the code value of the training control code SCD corresponding to a minimum difference between the duty ratio of the buffer signal SB and the reference duty ratio. The operation of the search logic SRL will be described below with reference to FIG. 14.

The register REG may store the code value from the search logic SRL as the optimum code OCD. The selector MUX may select one of the training control code SCD from the search logic SRL and the optimum code OCD from the register REG in response to a mode signal MD to output the selected one as the control code CCD.

Even though not illustrated in FIG. 13, the duty detector 90 and the search logic SRL may be enabled only in the training mode and disabled in the normal mode in response to the mode signal MD. The mode signal MD may be provided from the internal circuit INTS in FIG. 1 and the logic level of the mode signal MD may indicate the training mode or the normal mode. The selector MUX may output the training control code SCD from the search logic SRL in the training mode. As a result, the reception buffer BF, the duty detector 90, the search logic SRL, the selector MUX and the reference voltage generator RVG may form a training loop in the training mode. Using the training loop, the optimum code OCD corresponding to the optimal reference voltage VREF may be searched for rapidly.

Figure 14:
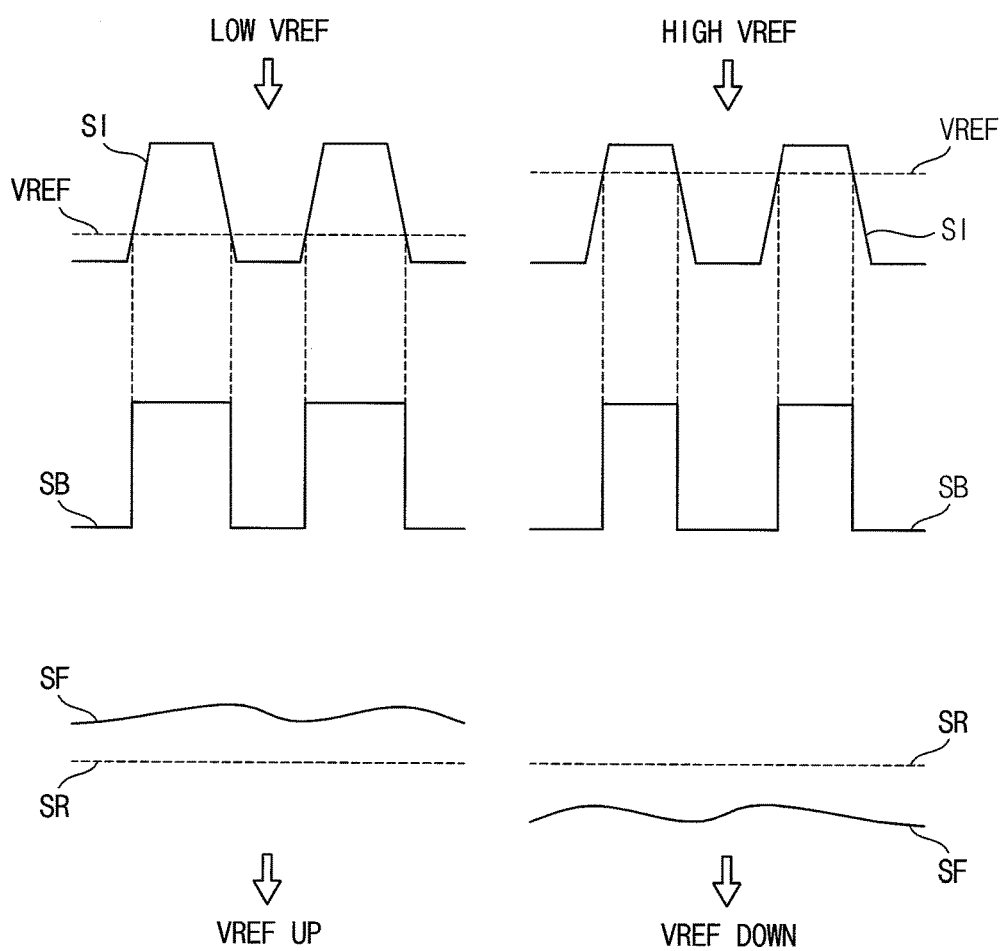
FIG. 14 is a diagram for describing an example embodiment of code search by the reception interface circuit of FIG. 13 in a training mode.

FIG. 14 is a diagram for describing an example embodiment of a code search by the reception interface circuit of FIG. 13 in a training mode.

Referring to FIGS. 13 and 14, the input signal SI may have a form of a clock signal that toggles between the high voltage level VIH and the low voltage level VIL. The duty ratio of the buffer signal SB may be relatively high when the reference voltage VREF is relatively low and the duty ratio of the buffer signal SB may be relatively low when the reference voltage VREF is relatively high.

When the duty ratio of the buffer signal SB is relatively high, the voltage level of the filter signal SF from the low pass filter LPF is higher than the voltage level of the reference signal SR. In contrast, when the duty ratio of the buffer signal SB is relatively low, the voltage level of the filter signal SF from the low pass filter LPF is lower than the voltage level of the reference signal SR. Such comparison results between voltage levels of the filter signal SF and the reference signal SR is provided by the comparison signal SC output from the comparator COM. The search logic SRL may change the training control code SCD to increase the reference voltage VREF when the logic level of the comparison signal SC indicates that the voltage level of the filter signal SF is higher than the reference signal SR. In contrast, the search logic SRL may change the training control code SCD to decrease the reference voltage VREF when the logic level of the comparison signal SC indicates that the voltage level of the filter signal SF is lower than the reference signal SR.

As described with reference to FIGS. 5, 6 and 7, the search logic SRL may change the code value of the training control code SCD and search for the code value of the training control code SCD corresponding to a minimum difference between the reference duty ratio and the duty ratio of the buffer signal SB based on the comparison signal SC.

Figure 15:
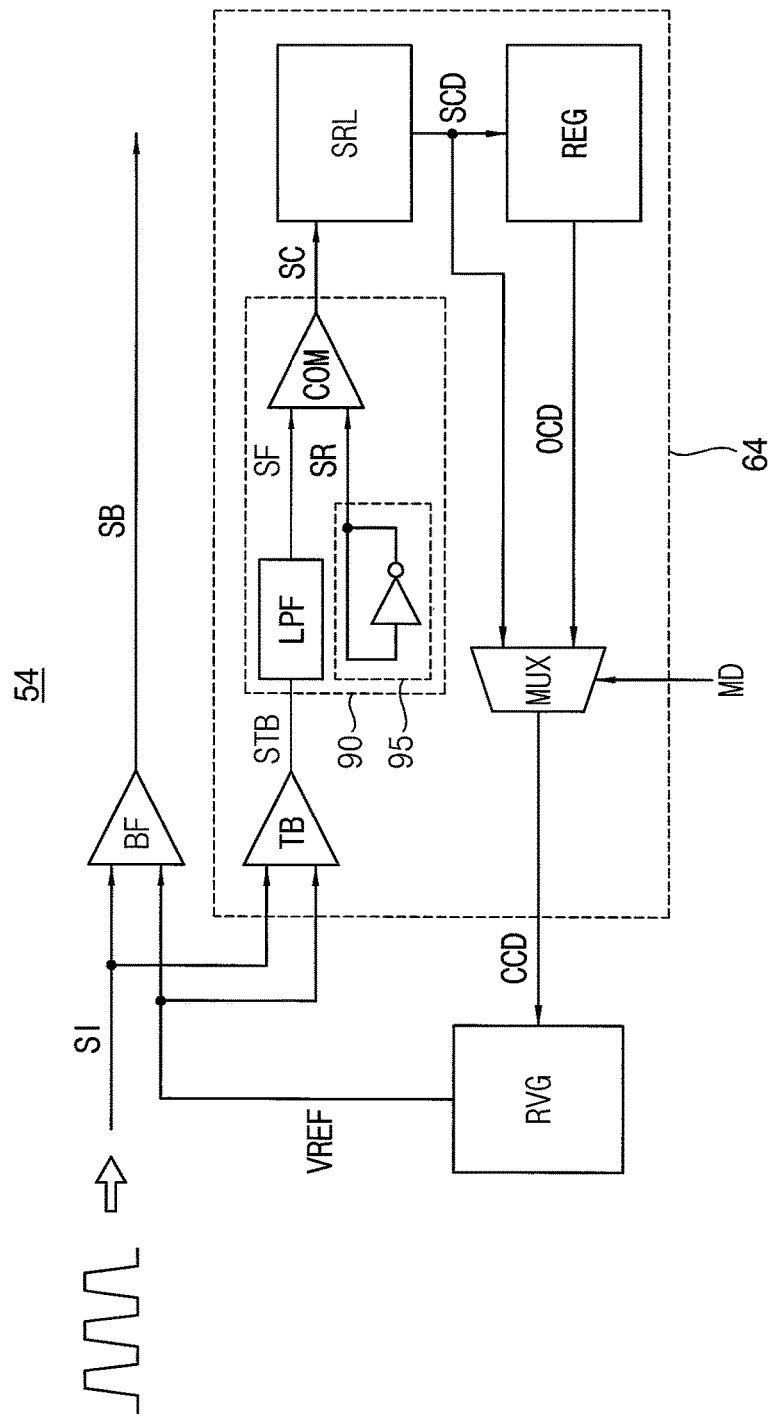
FIG. 15 is a diagram illustrating a reception interface circuit according to example embodiments.

FIG. 15 is a diagram illustrating a reception interface circuit according to example embodiments.

Referring to FIG. 15, a reception interface circuit 54 may include a reception buffer BF, a reference voltage generator RVG and a self-training circuit 64. The reception buffer BF may compare an input signal SI with a reference voltage VREF to generate a buffer signal SB. The reference voltage generator RVG may generate the reference voltage VREF in response to a control code CCD.

As described above, the self-training circuit 64 may output a training control code SCD as the control code CCD in a training mode such that the training control code SCD is changed sequentially to search for an optimum code OCD corresponding to an optimal voltage level of the reference voltage VREF and output the optimum code OCD as the control code CCD in a normal mode. To provide the control code CCD, the self-training circuit 64 may include a training buffer TB, a duty detector 90, a search logic SRL, a register REG and a selector MUX.

The training buffer TB may compare the input signal SI with the reference voltage VREF to generate a training buffer signal STB.

The duty detector 90 may compare a duty ratio of the training buffer signal STB from the training buffer TB with a reference duty ratio to generate a comparison signal SC. The duty detector 90 may include a low pass filter LPF, a reference signal generator 95 and a comparator COM. The low pass filter LPF may perform low pass filtering on the training buffer signal STB to generate a filter signal SF having a voltage level corresponding to the duty ratio of the training buffer signal STB. The reference signal generator 95 may generate a reference signal SR having a voltage level corresponding to the reference duty ratio. For example, the reference signal generator 95 may include an inverter and its input and output are connected. The reference duty ratio may be set by adjusting a size ratio between a PMOS transistor and an NMOS transistor in the inverter. The comparator COM may compare the filter signal SF and the reference signal SR to generate the comparison signal SC having the logic high level or the logic low level.

The search logic SRL may generate the training control code SCD that is changed sequentially in the training mode and search for a code value of the training control code SCD corresponding to a minimum difference between the duty ratio of the training buffer signal STB and the reference duty ratio based on the comparison signal SC from the duty detector 90. When the input signal SI has a form of a clock signal that toggles between the high voltage level VIH and the low voltage level VIL, the training buffer signal STB has the duty ratio that changes depending on the reference voltage VREF. For example, the reference duty ration may be set to 50% and the search logic SRL may search for the code value of the training control code SCD corresponding to a minimum difference between the duty ratio of the training buffer signal STB and the reference duty ratio. The operation of the search logic SRL is the same as described with reference to FIG. 14.

The register REG may store the code value from the search logic SRL as the optimum code OCD. The selector MUX may select one of the training control code SCD from the search logic SRL and the optimum code OCD from the register REG in response to a mode signal MD to output the selected one as the control code CCD.

Even though not illustrated in FIG. 15, the training buffer TB, the duty detector 90 and the search logic SRL may be enabled only in the training mode and disabled in the normal mode in response to the mode signal MD. The mode signal MD may be provided from the internal circuit INTS in FIG. 1 and the logic level of the mode signal MD may indicate the training mode or the normal mode. The selector MUX may output the training control code SCD from the search logic SRL in the training mode. As a result, the training buffer TB, the duty detector 90, the search logic SRL, the selector MUX and the reference voltage generator RVG may form a training loop in the training mode. Using the training loop, the optimum code OCD corresponding to the optimal reference voltage VREF may be searched for rapidly.

In comparison with the self-training circuit 63 in FIG. 13, the self-training circuit 62 in FIG. 15 further includes the training buffer TB. A configuration of the training buffer TB may be equal to a configuration of the reception buffer BF so that the training buffer TB has the same operational characteristics as the reception buffer BF. In case of FIG. 13, the code search is performed using the buffer signal SB output from the reception buffer BF. In this case, the reception buffer BF is included in the training loop and thus the optimal reference voltage VREF determined by the training operation may cancel a DC input offset even though the reception buffer BF has the DC input offset. In case of FIG. 15, the reception buffer BF is excluded from the training loop, the training buffer TB is used in the training mode, and thus effects of the self-training circuit 64 on the output impedance of the reception buffer BF may be reduced or prevented in the normal mode.

Figure 16:
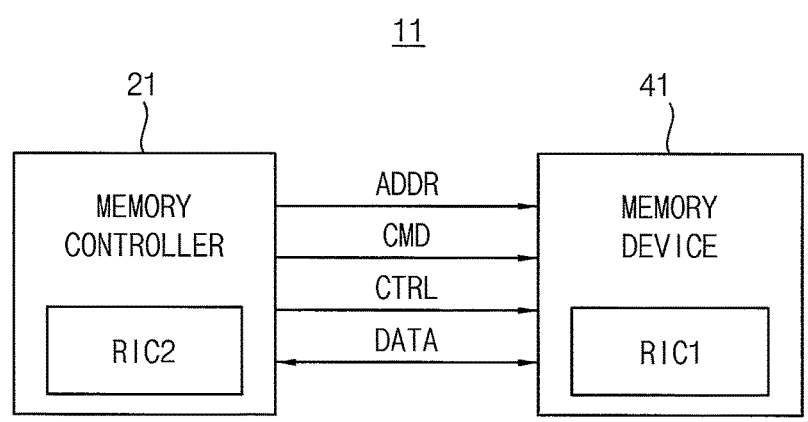
FIG. 16 is a block diagram illustrating a memory system according to example embodiments.

FIG. 16 is a block diagram illustrating a memory system according to example embodiments.

Referring to FIG. 16, a memory system 11 may include a memory controller 21 and a memory device 41. The memory controller 21 may control the memory device 41 in response to signals received from an external device such as a host, an application processor, etc. For example, the memory controller 21 may transfer data DATA, an address ADDR, a command CMD and a control signal CTRL to the memory device 41 in response to the request from the external device.

The memory device 41 may perform the read operation, the write (program) operation, the erase operation, etc. according to the control of the memory controller 21.

The memory device 41 may include a reception interface circuit RIC1 for performing the self-training operation as described with reference to FIGS. 1 through 15. In addition, the memory controller 21 may include a reception interface circuit RIC2 for performing the self-training operation. The reception interface circuits RIC1 and RIC2 may be included in the memory device 41 and the memory controller 21 respectively for training the respective reference voltages for receiving the high-speed data transferred bi-directionally.

FIGS. 17A, 17B, 18A, 18B, 19A, 19B, 20A and 20B are timing diagrams illustrating example embodiments of a training mode in the system of FIG. 16.

Figure 17A:
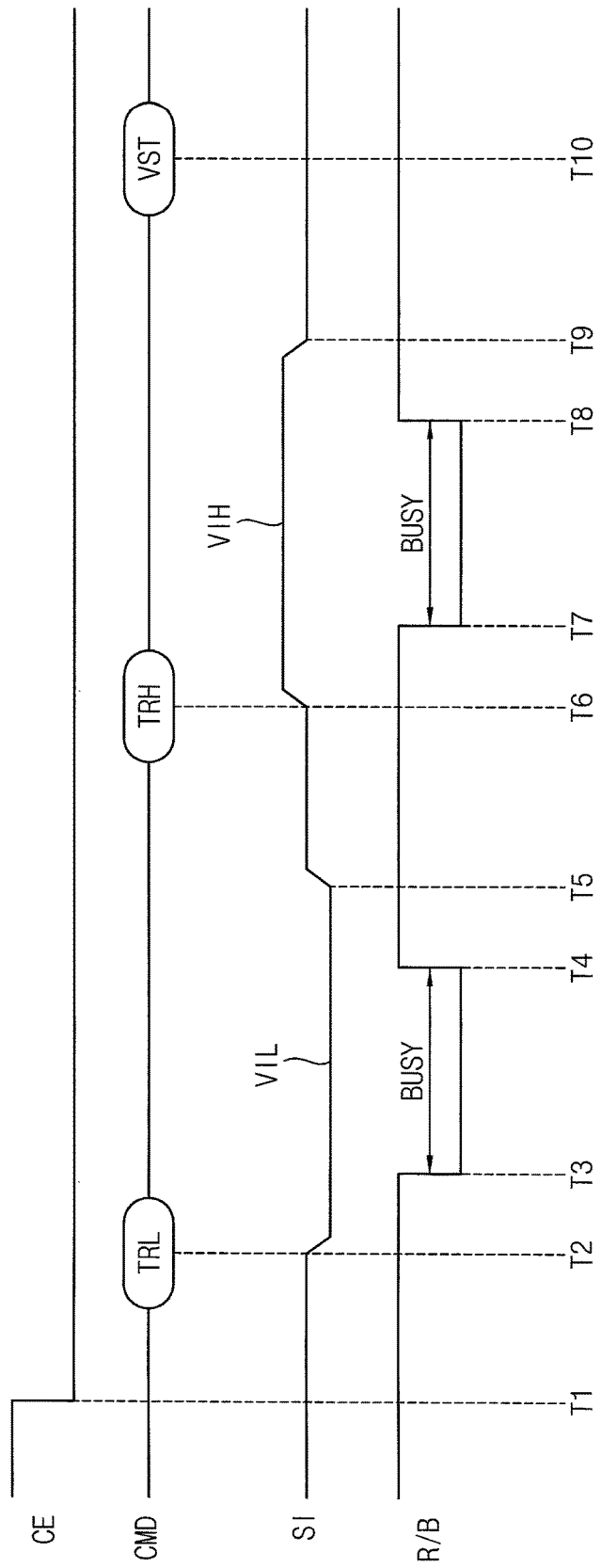
Figure 17B:
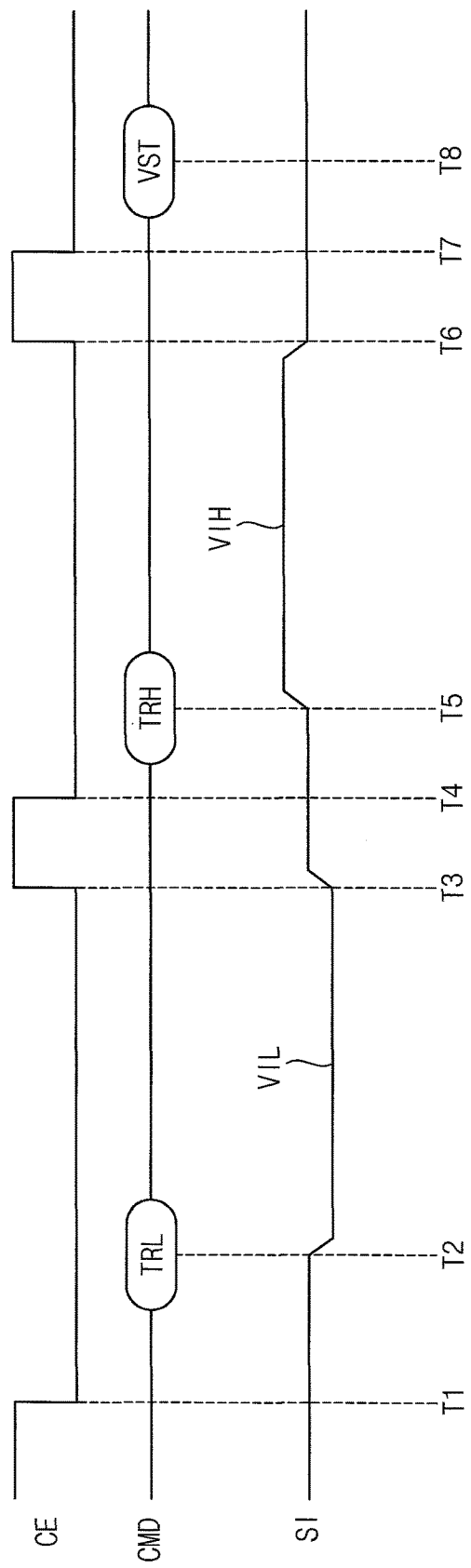

FIGS. 17A and 17B illustrate a training mode of searching for both of the low voltage level VIL and the high voltage level VIH of the input signal SI sequentially. For example, the training mode of searching for both of the low voltage level VIL and the high voltage level VIH may be performed in case of the CTT scheme as described with reference to FIGS. 8A and 8B and in case of the untermination scheme as described with reference to FIGS. 9A and 9B.

Referring to FIG. 17A, at time point T1, the memory controller 21 may activate a chip enable signal CE to the logic low level, which is applied to the memory device 41. When the chip enable signal CE is activated, the corresponding memory chip in the memory device 41 may be selected and enabled.

At time point T2, the memory controller 21 may transfer a low training command TRL indicating the training of the low voltage level VIL of the input signal SI to the memory device 41. At time point T2 or slightly delayed time point, the memory controller 21 may drive the input-output pad with the logic low level and the memory device 41 may receive the input signal SI of the low voltage level VIL.

At time T3, the memory device 41 may start the training of the low voltage level VIL and activate the ready-busy signal RB to the logic low level, which is transferred to the memory controller 21, to inform that the memory device 41 is in a busy state. Even though not illustrated in FIG. 17A, the memory device 41 may activate the above-mentioned mode signal MD to inform that the current operation mode is the training mode to the reception interface circuit RIC1. The reception interface circuit RIC1 may search for the low code value CVL corresponding to the low voltage level VIL with changing the training control code SCD as described above.

At time T4, the training of the low voltage level VIL of the input signal SI is completed, the memory device 41 may store the low code value CVL corresponding to the low voltage level VIL in the register REG as the search result and deactivate the ready-busy signal RB to the logic high level to inform that the memory device 41 is in a ready state.

At time point T5, the memory controller 21 may disable the transmission driver and the input signal SI may return to the original state, for example, to the high-impedance state.

At time point T6, the memory controller 21 may transfer a high training command TRH indicating the training of the high voltage level VIH of the input signal SI to the memory device 41. At time point T6 or slightly delayed time point, the memory controller 21 may drive the input-output pad with the logic high level and the memory device 41 may receive the input signal SI of the high voltage level VIH.

At time T7, the memory device 41 may start the training of the high voltage level VIH and activate the ready-busy signal R/B to the logic low level, which is transferred to the memory controller 21, to inform that the memory device 41 is in the busy state. Even though not illustrated in FIG. 17A, the memory device 41 may activate the above-mentioned mode signal MD to inform that the current operation mode is the training mode to the reception interface circuit RIC1. The reception interface circuit RIC1 may search for the high code value CVH corresponding to the high voltage level VIII with changing the training control code SCD as described above.

At time T8, the training of the high voltage level VIH of the input signal SI is completed, the memory device 41 may store the high code value CVH corresponding to the high voltage level VIH in the register REG as the search result and deactivate the ready-busy signal R/B to the logic high level to inform that the memory device 41 is in the ready state.

At time point T9, the memory controller 21 may disable the transmission driver and the input signal SI may return to the original state, for example, to the high-impedance state.

At time point T10, the memory controller 21 may transfer a voltage set command VST indicating the end of the training mode to the memory device 41. The memory device 41 may deactivate the mode signal MD to inform that the current operation mode is the normal mode to the reception interface circuit RIC1. The reception interface circuit RIC1 may calculate the optimum code OCD corresponding to the optimal reference voltage VREF based on the code values stored in the register REG. The selector MUX in the reception interface circuit RIC1 may provide the optimum code OCD as the control code CCD to the reference voltage generator RVG in response to the mode signal MD indicating the normal mode.

Referring to FIG. 17B, at time point T1, the memory controller 21 may activate a chip enable signal CE to the logic low level, which is applied to the memory device 41. When the chip enable signal CE is activated, the corresponding memory chip in the memory device 41 may be selected and enabled.

At time point T2, the memory controller 21 may transfer a low training command TRL indicating the training of the low voltage level VIL of the input signal SI to the memory device 41. At time point T2 or slightly delayed time point, the memory controller 21 may drive the input-output pad with the logic low level and the memory device 41 may receive the input signal SI of the low voltage level VIL. The memory device 41 may activate the above-mentioned mode signal MD to inform that the current operation mode is the training mode to the reception interface circuit RIC1. The reception interface circuit RIC1 may search for the low code value CVL corresponding to the low voltage level VIL with changing the training control code SCD as described above.

At time T3, the memory controller 21 may determine that a time required for the self-training in the memory device 41 is elapsed and deactivate the chip enable signal CE to the logic high level. The memory controller 21 may disable the transmission driver and the input signal SI may return to the original state, for example, to the high-impedance state.

The memory controller 21 determines the end of the self-training based on the ready-busy signal RB from the memory device 41 in case of FIG. 17A, but the memory controller 21 has to determine the end of the self-training by itself without feedback from the memory device 41 in case of FIG. 17B.

At time point T4, the memory controller 21 may activate the chip enable signal CE to the logic low level, which is applied to the memory device 41. When the chip enable signal CE is activated, the corresponding memory chip in the memory device 41 may be selected and enabled.

At time point T5, the memory controller 21 may transfer a high training command TRH indicating the training of the high voltage level VIH of the input signal SI to the memory device 41. At time point T5 or slightly delayed time point, the memory controller 21 may drive the input-output pad with the logic high level and the memory device 41 may receive the input signal SI of the high voltage level VIH. The memory device 41 may activate the above-mentioned mode signal MD to inform that the current operation mode is the training mode to the reception interface circuit RIC1. The reception interface circuit RIC1 may search for the high code value CVH corresponding to the high voltage level VIH with changing the training control code SCD as described above.

At time T6, the memory controller 21 may determine that a time required for the self-training in the memory device 41 is elapsed and deactivate the chip enable signal CE to the logic high level. The memory controller 21 may disable the transmission driver and the input signal SI may return to the original state, for example, to the high-impedance state.

At time point T7, the memory controller 21 may activate a chip enable signal CE to the logic low level, which is applied to the memory device 41. When the chip enable signal CE is activated, the corresponding memory chip in the memory device 41 may be selected and enabled.

At time point T8, the memory controller 21 may transfer a voltage set command VST indicating the end of the training mode to the memory device 41. The memory device 41 may deactivate the mode signal MD to inform that the current operation mode is the normal mode to the reception interface circuit RIC1. The reception interface circuit RIC1 may calculate the optimum code OCD corresponding to the optimal reference voltage VREF based on the code values stored in the register REG and may provide the optimum code OCD as the control code CCD to the reference voltage generator RVG in response to the mode signal MD indicating the normal mode.

In the similar way, the training mode described with respect to FIG. 17B may be applied to the reception interface circuit RIC2 in the memory controller 21. In this case, the memory device 41 may drive the input-output pad in response to the training commands TRL and TRH from the memory controller 21 and thus the memory controller 21 may receive the input signal SI as illustrate in FIG. 17B to perform the training of the reference voltage VREF based on the input signal SI from the memory device 41.

As described with reference to FIGS. 17A and 17B, the reception interface circuit RIC1 in the memory device 41 may start the training mode in response to the commands TRL, TRH and TRD from the memory controller 21. In addition, the memory device 41 may feedback the ready-busy signal RB as described above to the memory controller 21.

Figure 18A:
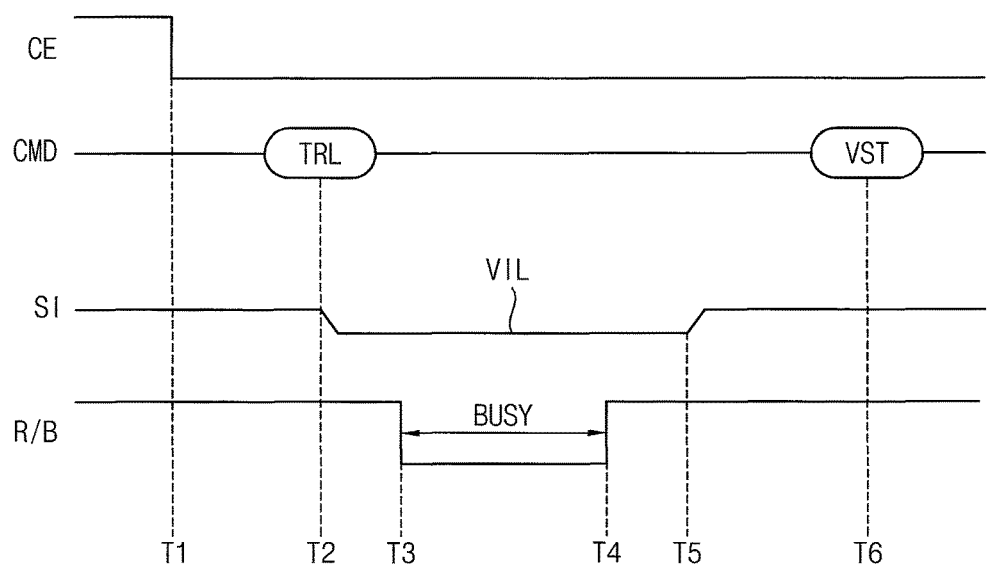
Figure 18B:
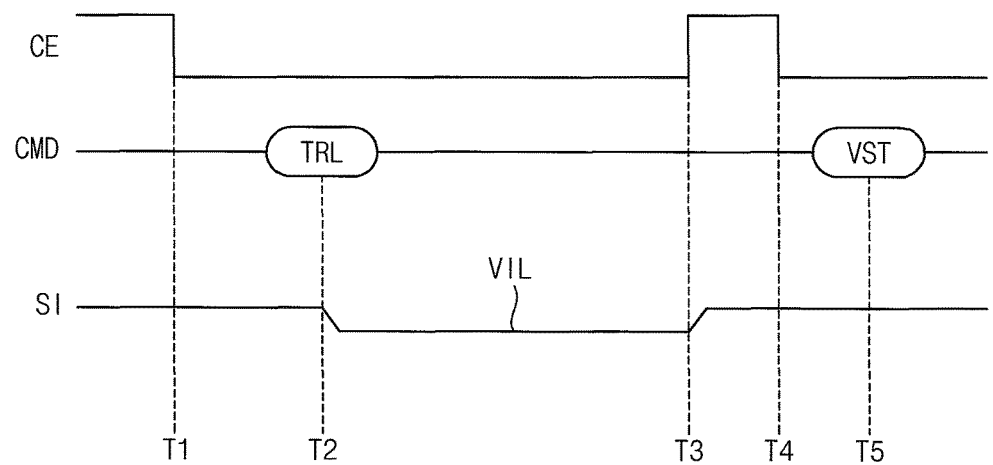
Figure 19A:
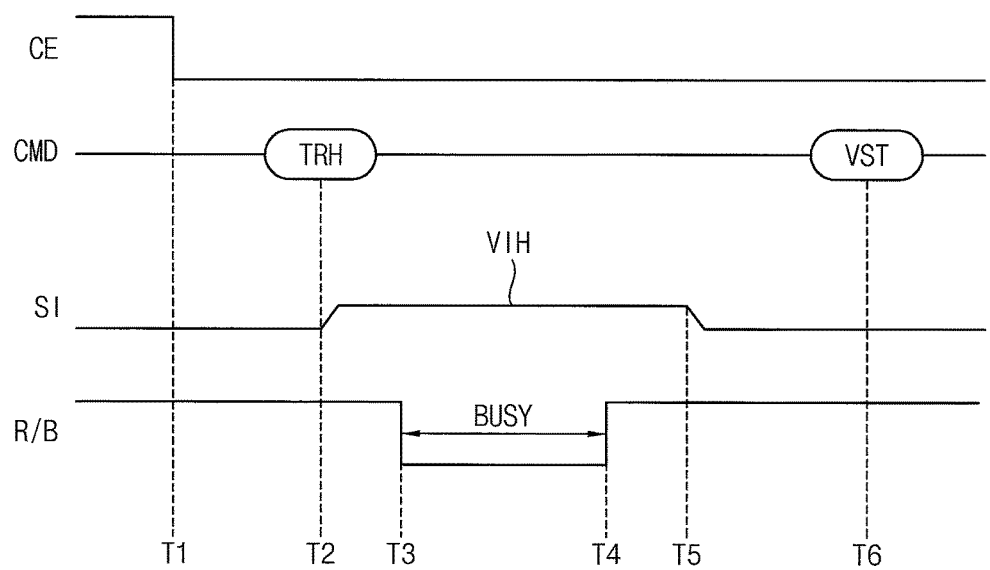
Figure 19B:
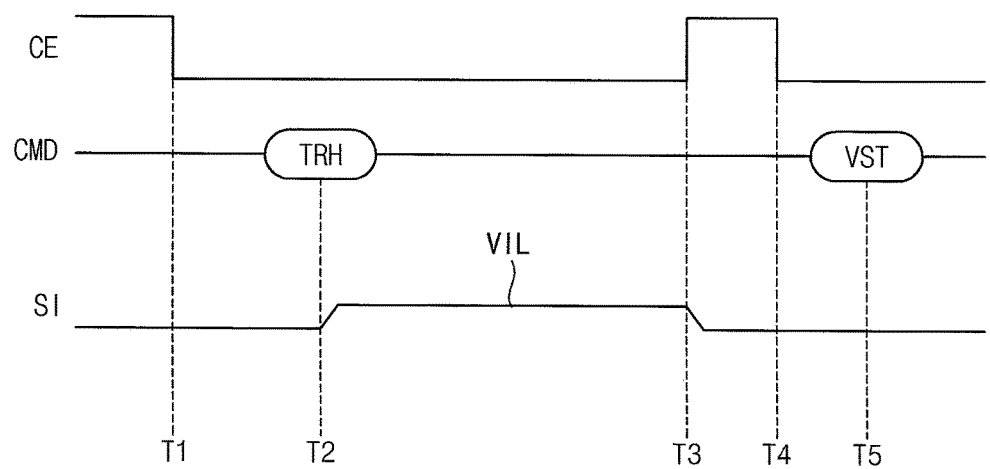

Certain descriptions of FIGS. 18A and 19A are substantially the same as FIG. 17A, and certain descriptions of FIGS. 18B and 19B are substantially the same as FIG. 17B and thus the repeated descriptions are omitted.

FIGS. 18A and 18B illustrate a training mode of searching for only the low voltage level VIL of the input signal SI. For example, the training mode of searching for the low voltage level VIL may be performed in case of the first POD termination scheme as described with reference to FIGS. 10A and 10B. As described above, the search logic SRL may search for only the low code value CVL to store the searched low code value CVL in the register REG and a default value, for example, a predetermined value may be stored in the register REG as the high code value CVH. For example, the default value of the high code value CVH may be provided based on the information stored in the mode register set included in the memory device 41.

FIGS. 19A and 19B illustrate a training mode of searching for only the high voltage level VIH of the input signal SI. For example, the training mode of searching for the high voltage level VIH may be performed in case of the second POD termination scheme as described with reference to FIGS. 11A and 11B. As described above, the search logic SRL may search for only the high code value CVH to store the searched high code value CVH in the register REG and a default value, for example, a predetermined value may be stored in the register REG as the low code value CVL. For example, the default value of the low code value CVL may be provided based on the information stored in the mode register set included in the memory device 41.

FIGS. 20A and 20B illustrate a training mode of searching for the optimum code OCD based on the input signal SI toggling between the low voltage level VIL and the high voltage level VIH. The training mode based on the toggling input signal SI may be performed regardless of the type of the termination schemes as described above.

Referring to FIG. 20A, at time point T1, the memory controller 21 may activate a chip enable signal CE to the logic low level, which is applied to the memory device 41. When the chip enable signal CE is activated, the corresponding memory chip in the memory device 41 may be selected and enabled.

At time point T2, the memory controller 21 may transfer a training command TRD indicating the training mode for the reference voltage VREF to the memory device 41. At time point T2 or slightly delayed time point, the memory controller 21 may drive the input-output pad with a signal togging in a form of clock signal and the memory device 41 may receive the input signal SI toggling between the low voltage level VIL and the high voltage level VIH.

At time T3, the memory device 41 may start the training of the reference voltage VREF and activate the ready-busy signal R/B to the logic low level, which is transferred to the memory controller 21, to inform that the memory device 41 is in a busy state. The reception interface circuit RIC1 may search for the optimum code OCD corresponding to the optimal voltage level of the reference voltage VREF based on the duty ratio of the buffer signal SB or the training buffer signal STB with changing the training control code SCD, for example sequentially, as described above.

At time T4, the training of the reference voltage VREF is completed, the memory device 41 may store the optimum code OCD in the register REG as the search result and deactivate the ready-busy signal R/B to the logic high level to inform that the memory device 41 is in a ready state.

At time point T5, the memory controller 21 may disable the transmission driver and the input signal SI may return to the original state, for example, to the high-impedance state.

At time point T6, the memory controller 21 may transfer a voltage set command VST indicating the end of the training mode to the memory device 41. The memory device 41 may deactivate the mode signal MD to inform that the current operation mode is the normal mode to the reception interface circuit RIC1. The reception interface circuit RIC1 may store the optimum code OCD in the register REG and the selector MUX in the reception interface circuit RIC1 may provide the optimum code OCD as the control code CCD to the reference voltage generator RVG in response to the mode signal MD indicating the normal mode.

Referring to FIG. 20B, at time point T1, the memory controller 21 may activate a chip enable signal CE to the logic low level, which is applied to the memory device 41. When the chip enable signal CE is activated, the corresponding memory chip in the memory device 41 may be selected and enabled.

At time point T2, the memory controller 21 may transfer a training command TRD indicating the training mode for the reference voltage VREF to the memory device 41. At time point T2 or slightly delayed time point, the memory controller 21 may drive the input-output pad with a signal togging in a form of clock signal and the memory device 41 may receive the input signal SI toggling between the low voltage level VIL and the high voltage level VIH. The memory device 41 may activate the above-mentioned mode signal MD to inform that the current operation mode is the training mode to the reception interface circuit RIC1. The reception interface circuit RIC1 may search for the optimum code OCD corresponding to the optimal voltage level of the reference voltage VREF with changing the training control code SCD, for example sequentially, as described above.

At time T3, the memory controller 21 may determine that a time required for the self-training in the memory device 41 is elapsed and deactivate the chip enable signal CE to the logic high level. The memory controller 21 may disable the transmission driver and the input signal SI may return to the original state, for example, to the high-impedance state.

The memory controller 21 determines the end of the self-training based on the ready-busy signal RB from the memory device 41 in case of FIG. 20A, but the memory controller 21 has to determine the end of the self-training by itself without feedback from the memory device 41 in case of FIG. 20B.

At time point T4, the memory controller 21 may activate the chip enable signal CE to the logic low level, which is applied to the memory device 41. When the chip enable signal CE is activated, the corresponding memory chip in the memory device 41 may be selected and enabled.

At time point T5, the memory controller 21 may transfer a voltage set command VST indicating the end of the training mode to the memory device 41. The memory device 41 may deactivate the mode signal MD to inform that the current operation mode is the normal mode to the reception interface circuit RIC1. The reception interface circuit RIC1 may store the optimum code OCD in the register REG and the selector MUX in the reception interface circuit RIC1 may provide the optimum code OCD as the control code CCD to the reference voltage generator RVG in response to the mode signal MD indicating the normal mode.

As described with reference to FIGS. 20A and 20B, the reception interface circuit RIC1 in the memory device 41 may start the training mode in response to the commands TRL, TRH and TRD from the memory controller 21. In addition, the memory device 41 may feedback the ready-busy signal RB as described above to the memory controller 21.

Figure 21:
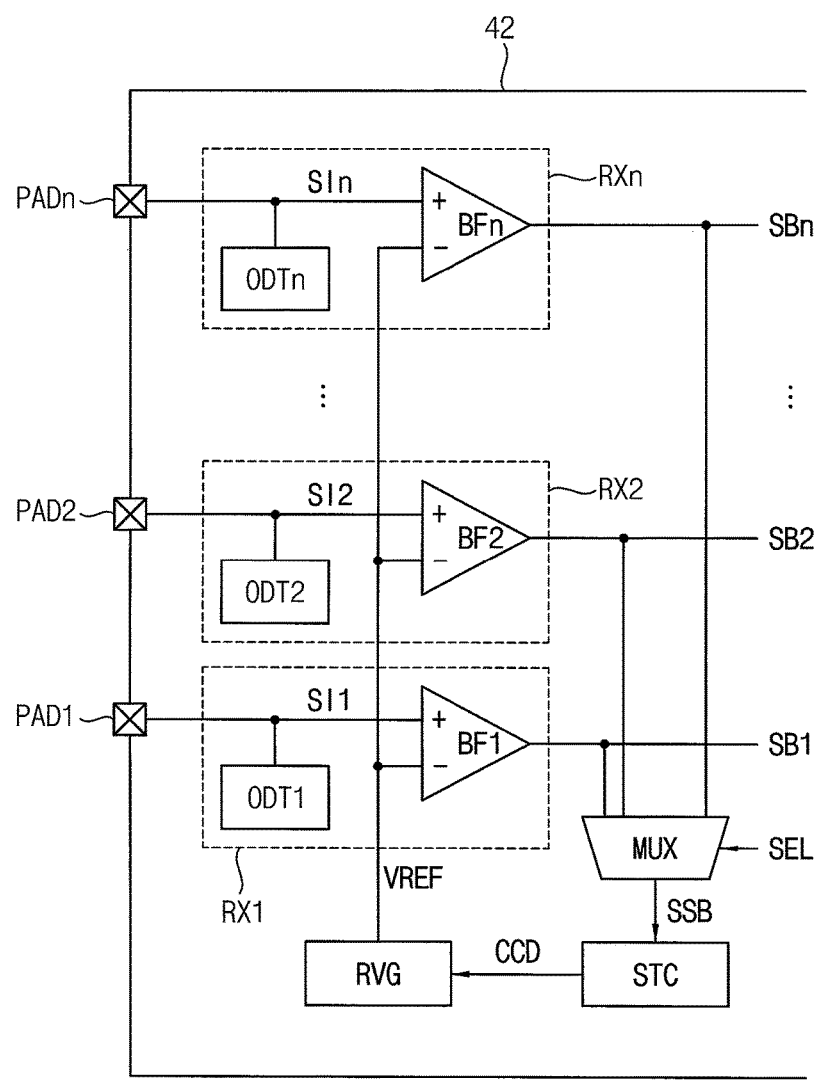
FIG. 21 is a diagram illustrating an example embodiment of a memory device included in the memory system of FIG. 16.

FIG. 21 is a diagram illustrating an example embodiment of a memory device included in the memory system of FIG. 16.

Referring to FIG. 21, a memory device 42 may include a plurality of input-output pads PAD1~PADn, a plurality of reception units RX1~RXn, a reference voltage generator RVG, a self-training circuit STC and a path selector MUX.

The input-output pads PAD1~PADn are connected to corresponding input-output pads of the memory controller through a plurality of transmission lines (not shown). The reception units RX1~RXn, also described as reception circuits, are connected to the input-output pads PAD1~PADn, respectively. The reception units RX1~RXn may compare input signals SI1~SIn with a reference voltage VREF to generate buffer signals SB1~SBn, respectively, and may include respective reception buffers. The reference voltage generator RVG generates the reference voltage VREF in response to a control code CCD. The self-training circuit STC outputs a training control code SCD as the control code CCD in a training mode such that the training control code SCD is changed (e.g., sequentially, in some embodiments) to search for an optimum code OCD corresponding to an optimal voltage level of the reference voltage VREF. The search logic SRL outputs the optimum code OCD as the control code CCD in a normal mode. The configurations and the operations of the self-training circuit STC and the reference voltage generator RVG are substantially the same as described with reference to FIGS. 1 through 15. The path selector MUX selects one reception unit RXi (i is an integer between 1 and n) of the reception units RX1~RXn in response to a selection control signal SEL to provide the buffer signal SBi from the selected reception unit RXi as a selection buffer signal SSB to the self-training circuit STC.

As a result, the selected one reception unit RXi, the path selector MUX, the self-training circuit STC and the reference voltage generator RVG may form a training loop in the training mode.

In some example embodiments, a value of the selection control signal SEL may be fixed during the training mode such that the self-training circuit STC may search for a single code value of the optimum code OCD corresponding to the selected reception unit RXi based on the selection control signal SEL. The reference voltage generator RVG may provide the reference voltage VREF corresponding to the single code value of the optimum code OCD commonly to the reception units RX1~RXn. The selected one reception unit (e.g., reception buffer) therefore may serve as a representative reception unit of the memory device 42 (or for a portion of the memory device 42) and can be used to determine the reference voltage to be generated by the reference voltage generator RVG.

In some example embodiments, the path selector MUX may be omitted. In this case, the signal lines may be routed physically so that one buffer signal SBi selected from the buffer signals SB1~SBn may be provided to the self-training circuit STC.

As illustrated in FIG. 21, the reception units RX1~RXn may include termination circuits ODT1~ODTn and reception buffers BF1~BFn, respectively. As will be described below with reference to FIG. 22, the one reception unit RXi may be selected in the training mode using the termination circuits ODT1~ODTn included in the reception units RX1~RXn. For example, in one embodiment, only the termination circuit ODTi in the selected reception unit RXi may be enabled and the termination circuits in the other reception units may be disabled.

Figure 22:
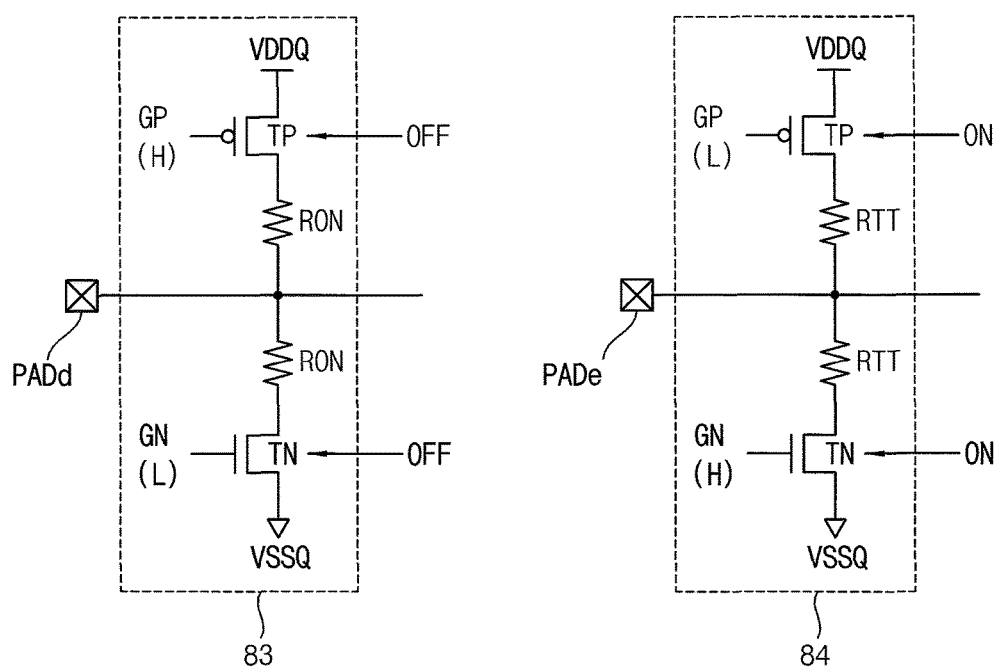
FIG. 22 is a diagram for describing selective enabling of reception units included in the memory device of FIG. 21.

FIG. 22 is a diagram for describing selective enabling of reception units included in the memory device of FIG. 21.

FIG. 22 represents operation states of a selected termination circuit 84 in the reception unit selected for the training of the reference voltage VREF and an unselected termination circuit 83 in the other unselected reception units. For example, as illustrated in FIG. 22, each of the termination circuits 83 and 84 may include a first sub termination circuit and a second sub termination circuit, where the first sub termination circuit includes a termination resistor RTT and a PMOS transistor TP and the second sub termination circuit includes a termination resistor RTT and an NMOS transistor TN.

In case of the selected termination circuit 84, a gate signal GP of the logic low level L is applied to a gate electrode of the PMOS transistor and a gate signal GN of the logic high level H is applied to a gate electrode of the NMOS transistor. Accordingly the input-output pad PADe corresponding to the selected termination circuit 84 may be connected to the first power supply voltage VDDQ and the second power supply voltage VSSQ and thus the selected reception circuit may be terminated with the CTT scheme.

In case of the unselected termination circuit 83, the gate signal GP of the logic high level H is applied to the gate electrode of the PMOS transistor and the gate signal GN of the logic low level L is applied to the gate electrode of the NMOS transistor. Accordingly the input-output pad PADd corresponding to the unselected termination circuit 83 may be disconnected from the first power supply voltage VDDQ and the second power supply voltage VSSQ and thus the unselected reception circuits may be unterminated.

Using the selective enabling of the termination circuits, the termination circuits of the different memory chips connected to the same package input-output pad may be prevented from being enabled simultaneously in the multi-chip package as will be described below.

Figure 23:
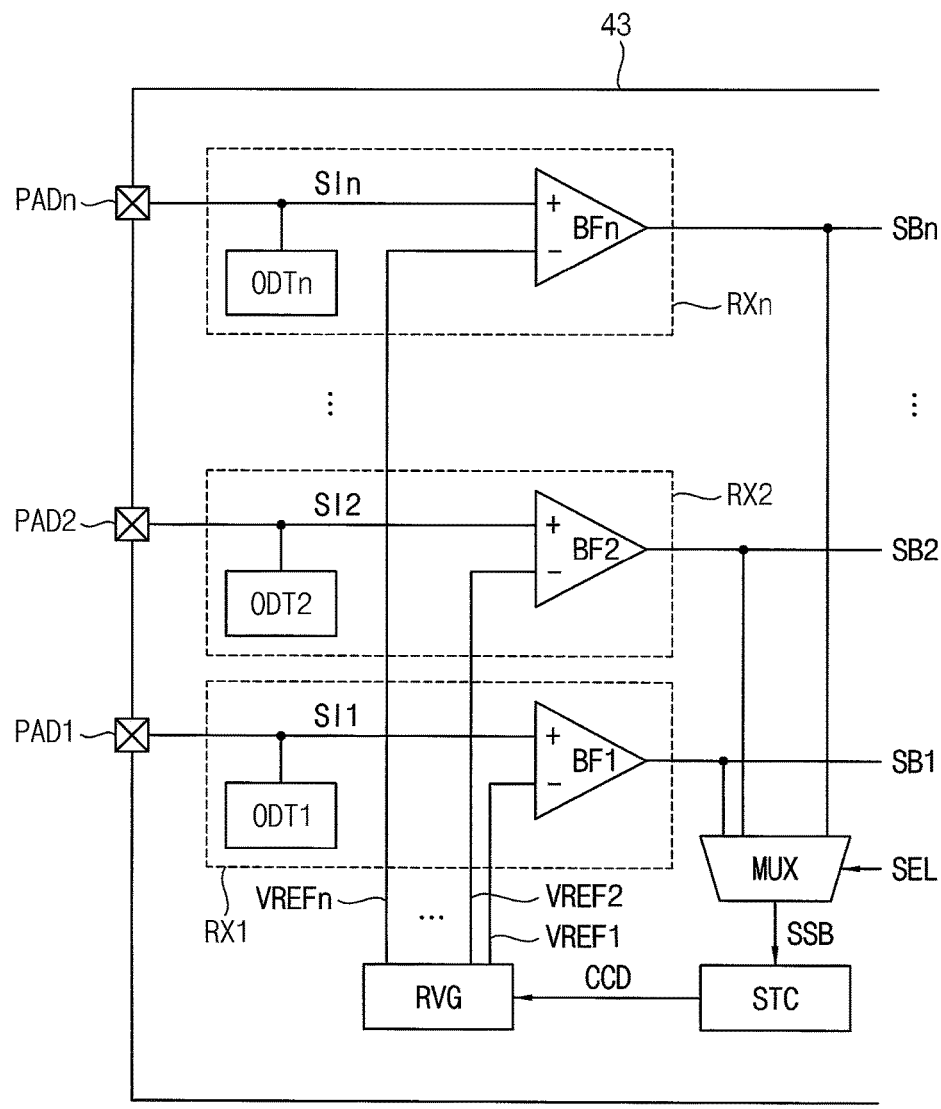
FIG. 23 is a diagram illustrating an example embodiment of a memory device included in the memory system of FIG. 16.
Figure 24:
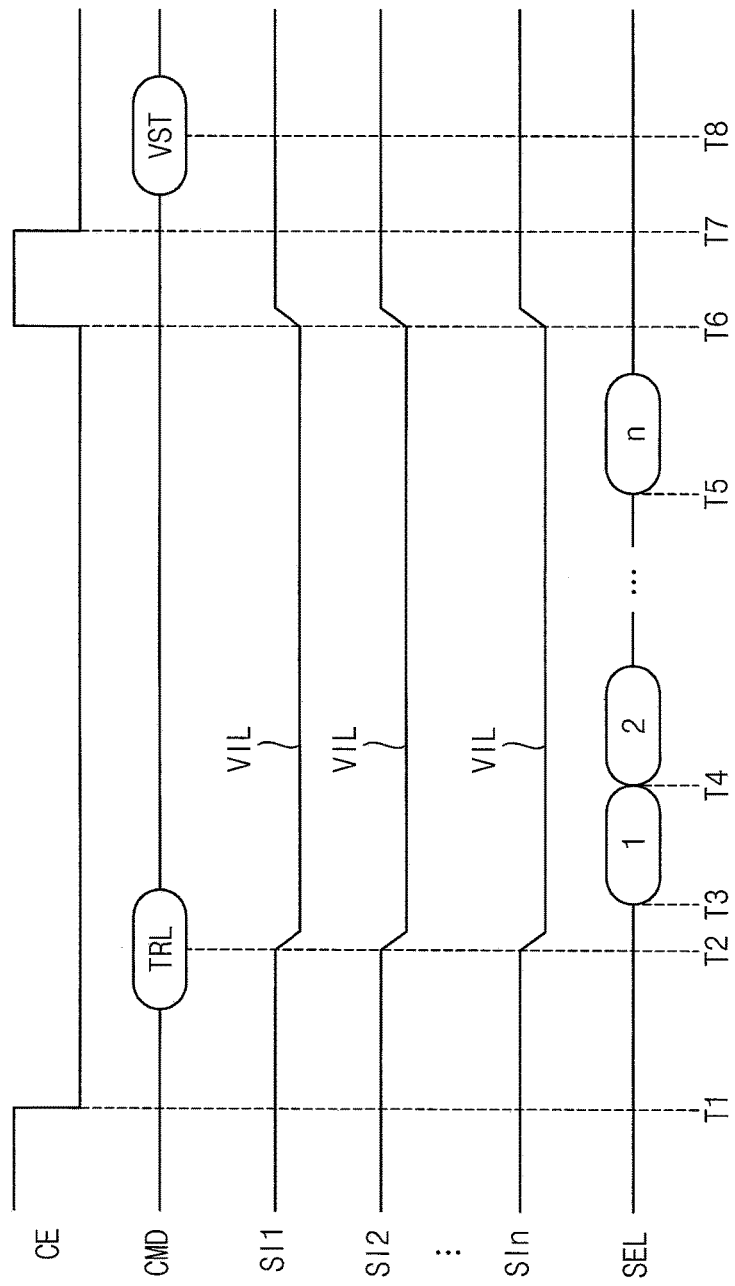
FIG. 24 is a timing diagram illustrating an example embodiment of a training mode in the memory device of FIG. 23.

FIG. 23 is a diagram illustrating an example embodiment of a memory device included in the memory system of FIG. 16, and FIG. 24 is a timing diagram illustrating an example embodiment of a training mode in the memory device of FIG. 23.

Referring to FIG. 23, a memory device 43 may include a plurality of input-output pads PAD1~PADn, a plurality of reception units RX1~RXn, a reference voltage generator RVG, a self-training circuit STC and a path selector MUX.

The input-output pads PAD1~PADn are connected to corresponding input-output pads of the memory controller through a plurality of transmission lines (not shown). The reception units RX1~RXn are connected to the input-output pads PAD1~PADn, respectively. The reception units RX1~RXn may compare input signals SI1~SIn with a reference voltage VREF to generate buffer signals SB1~SBn, respectively. The reference voltage generator RVG generates the reference voltage VREFi (i is an integer between 1 and n) in response to a control code CCD. The self-training circuit STC outputs a training control code SCD as the control code CCD in a training mode such that the training control code SCD is changed sequentially to search for an optimum code OCD corresponding to an optimal voltage level of the reference voltage VREF. The search logic SRL outputs the optimum code OCD as the control code CCD in a normal mode. The configurations and the operations of the self-training circuit STC and the reference voltage generator RVG are substantially the same as described with reference to FIGS. 1 through 15. The path selector MUX selects one reception unit RXi of the reception units RX1~RXn in response to a selection control signal SEL to provide the buffer signal SBi from the selected reception unit RXi as a selection buffer signal SSB to the self-training circuit STC.

As a result, the selected one reception unit RXi, the path selector MUX, the self-training circuit STC and the reference voltage generator RVG may form a training loop in the training mode. The different path selector MUXes are also herein referred to as selection circuits.

Referring to FIG. 24, at time point T1, the memory controller may activate a chip enable signal CE to the logic low level, which is applied to the memory device 43. When the chip enable signal CE is activated, the corresponding memory chip in the memory device 43 may be selected and enabled.

At time point T2, the memory controller may transfer a command indicating the training of the reference voltage VREF to the memory device 43. FIG. 24 illustrates an example of the low training command TRL indicating the training of the low voltage level VIL of the input signals SI1~SIn. In this case, the memory controller drive the input-output pads with the logic low level and the memory device 43 may receive the input signal SI1~SIn of the low voltage level VIL. If the memory controller transfers the high training command TRH indicating the training of the high voltage level VIH of the input signals SI1~SIn to the memory device 43, the memory controller may drive the input-output pads with the logic high level and the memory device 43 may receive the input signal SI1~SIn of the high voltage level VIH. If the memory controller transfers the training command TRD indicating the training of the reference voltage VREF to the memory device 43, the memory controller may drive the input-output pads with signals toggling in a form of a clock signal and the memory device 43 may receive the input signal SI1~SIn toggling between the low voltage level VIL and the high voltage level VIH.

As described above in connection with FIGS. 21 and 23, a semiconductor device may include a plurality of buffers and each buffer can be connected to receive a first input and a second input. For example, each buffer may be connected to a respective input/output pad to receive as the first input a respective input signal. A reference voltage generator may be connected to each of the buffers and may output a reference voltage output, so that each buffer receives an output from the reference voltage generator as the second input. Each buffer may output a respective buffer output, and a selection circuit, such as multiplexer, is configured to select one buffer output from the plurality of buffer outputs. The selected buffer output may be used to adjust the reference voltage output from the reference voltage generator.

In addition, according to the discussion above of FIGS. 21 and 23, a self-training circuit may be connected between the multiplexer and the reference voltage generator. The self-training circuit may, during a training mode, output a training control code that controls the reference voltage output from the reference voltage generator. During a normal operational mode, the self-training circuit may output an operational control code that controls the reference voltage output from the reference voltage generator.

As illustrated in FIG. 24, a value of the selection control signal SEL may be changed, for example sequentially, during the training mode. For example, the selection control signal SEL may have the value of 1 at time point T3, the value of 2 at time point T4, and in this way the value of n at time point T5. According to the sequentially-changed value of the selection control signal SEL, the path selector MUX may select the reception units RX1~RXn sequentially and provide the buffer signals BS1~BSn sequentially as the selection buffer signal SSB to the self-training circuit STC. In this manner, self training of reference voltages for a plurality of different buffers connected to a plurality of different respective pads on a memory device may occur simultaneously.

The self-training circuit STC may search for code values of the optimum code OCD corresponding to the reception units RX1~RXn respectively based on the selection control signal SEL during the training mode. The reference voltage generator RVG may provide the reference voltages VREF1~VREFn corresponding to the code values of the optimum code OCD respectively to the reception units RX1~RXn during the normal mode.

At time point T6, the self-training is completed and the memory controller may deactivate the chip enable signal CE to the logic high level. The memory controller may disable the transmission drivers and the input signals SI1~SIn may return to the original state, for example, to the high-impedance state.

At time point T7, the memory controller may activate the chip enable signal CE to the logic low level, which is applied to the memory device 43. When the chip enable signal CE is activated, the corresponding memory chip in the memory device 43 may be selected and enabled.

At time point T8, the memory controller may transfer a voltage set command VST indicating the end of the training mode to the memory device 43. The memory device 43 may deactivate the mode signal MD to inform that the current operation mode is the normal mode to the self-training circuit STC. The self-training circuit STC may store the code values of the optimum code OCD in the register REG and the reference voltage generator RVG may provide the reference voltages VREF1~VREFn based on the code values of the optimum code OCD during the normal mode. For example, optimum codes OCD for the different buffers may be stored separately in the register REG of the self-training circuit STC.

Figure 25:
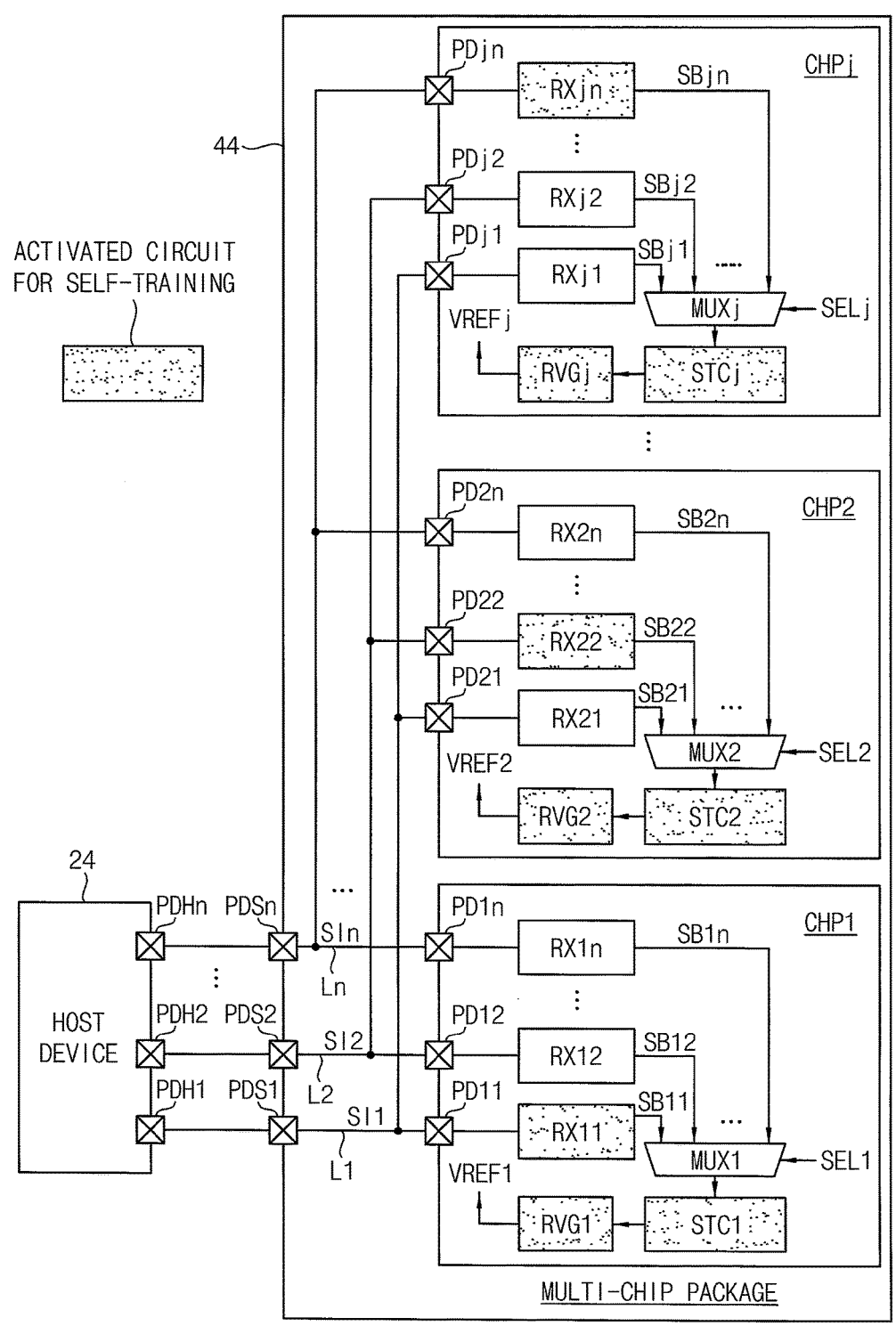
FIG. 25 is a block diagram illustrating a memory system according to example embodiments.

FIG. 25 is a block diagram illustrating a memory system according to example embodiments, and FIG. 26 is a timing diagram illustrating an example embodiment of a training mode in the memory system of FIG. 25.

Referring to FIG. 25, a memory system 14 may include a host device 24 and a memory device 44. The memory device 44 may be implemented as a multi-chip package and the host device 24 may include a memory controller.

The multi-chip package 44 may include a plurality of package input-output pads PDS1~PDSn connected to input-output pads PDH1~PDHn of the memory controller 24 and a plurality of memory chips CHP1~CHPj commonly connected to the package input-output pads PDS1~PDSn.

Each memory chip CHPi (i is an integer between 1 and j) of the memory chips CHP1~CHPj may include a plurality of chip input-output pads PDi1~PDin, a plurality of reception units RXi1~RXin, a reference voltage generator RVGi, a self-training circuit STCi and a path selector MUXi. The chip input-output pads PDi1~PDin may be connected to the package input-output pads PDS1~PDSn, respectively. The reception units RXi1~RXin may be connected to the chip input-output pads PDi1~PDin, respectively, and the reception units RXi1~RXin may compare input signals SI1~SIn with a reference voltage VREFi to generate buffer signals SBi1~SBin, respectively. The reference voltage generator RVGi may generate the reference voltage VREFi in response to a control code. The self-training circuit STCi may output a training control code as the control code in a training mode such that the training control code is changed (e.g., sequentially in some cases) to search for an optimum code corresponding to an optimal voltage level of the reference voltage VREFi, and output the optimum code as the control code in a normal mode. The configurations and the operations of the self-training circuit STCi and the reference voltage generator RVGi are substantially the same as described with reference to FIGS. 1 through 15. The path selector MUXi selects one reception unit RXik (k is an integer between 1 and n) of the reception units RXi1~RXin in response to a selection control signal SELi to provide the buffer signal SBik from the selected reception unit RXik as a selection buffer signal to the self-training circuit STCi.

As a result, with respect to each memory chip CHPi, the selected one reception unit RXik, the path selector MUXi, the self-training circuit STCi and the reference voltage generator RVGi may form a training loop in the training mode. As can be seen from FIG. 25, in some embodiments, a first reception unit (e.g., RX11) of the first memory chip is connected to receive an input signal from a first input/output line (e.g., L1) of the memory device, a second reception unit (e.g., RX22) of the second memory chip is connected to receive an input signal from a second input/output line (e.g., L2) of the memory device, a third reception unit (e.g., RXjn) of a third memory chip is connected to receive an input signal from a third input/output line (e.g., Ln) of the memory device (n having a value of 3 or more, and j having a value of 3 of more, where j is greater than or equal to n). The first input/output line may be shared in common between the first memory chip, second memory chip, and third memory chip, the second input/output line may also be shared in common between the first memory chip, second memory chip, and third memory chip, and the third input/output line may also be shared in common between the first memory chip, second memory chip, and third memory chip. The different input/output lines may be different and separate from each other. The training mode can be performed for the first memory chip at the same time as performing the training mode for the second memory chip, for example, by operating the first reception unit at the same time as operating the second reception unit.

Referring to FIG. 26, at time point T1, the host device 24, which may be or may include a memory controller 24 may activate chip enable signals CE1~CEn to the logic low level, which are applied to the memory device 44. When the chip enable signals CE1~CEn are activated, the n memory chips CHP1~CHPn in the memory device 44 may be selected and enabled simultaneously.

At time point T2, the memory controller 24 may transfer a command indicating the training of the reference voltages VREF1~VREFn to the memory device 44. FIG. 26 illustrates an example of the low training command TRL indicating the training of the low voltage level VIL of the input signals SI1~SIn. In this case, the memory controller 24 drive the input-output pads PDH1~PDHn with the logic low level and the memory device 44 may receive the input signal SI1~SIn of the low voltage level VIL through the package input-output pads PDS1~PDSn. If the memory controller 24 transfers the high training command TRH indicating the training of the high voltage level VIH of the input signals SI1~SIn to the memory device 44, the memory controller 24 may drive the input-output pads PDH1~PDHn with the logic high level and the memory device 44 may receive the input signal SI1~SIn of the high voltage level VIH through the input-output pads PDS1~PDSn. If the memory controller 24 transfers the training command TRD indicating the training of the reference voltages VREF1~VREFn to the memory device 43, the memory controller 24 may drive the input-output pads PDH1~PDHn with signals toggling in a form of a clock signal and the memory device 44 may receive the input signal SI1~SIn toggling between the low voltage level VIL and the high voltage level VIH through the package input-output pads PDS1~PDSn.

As illustrated in FIG. 26, in some embodiments, the selection control signals SEL1~SELn for the respective memory chips CHP1~CHPn may have different values during the training mode. For example, the first selection control signal SEL1 may have a value of 1, the second selection control signal SEL2 may have a value of 2, and in this way the n-th selection control signal SELn may have a value of n. Thus, different reception units may be trained at the same time on different chips. For example, a first reception unit of a first chip, the first reception unit being connected to a first I/O pad of the host device (and respective I/O pad of the multi-chip package), can be trained at the same time as a second reception unit of a second chip, the second reception unit being connected to a second, different I/O pad of the host device (and respective I/O pad of the multi-chip package).

In response to the selection control signals SEL1~SELn having the different values, the reception units of the different memory chips may be enabled one by one per package input-output pad. For example, the first reception unit RX11 may be enabled in the first memory chip CHP1, the second reception unit RX22 may be enabled in the second memory chip CHP2, and in this way the n-th reception unit RXnn may be enabled in the n-th memory chip CHPn. As such, the reception units RX11, RX22 and RXnn of the different memory chips CHP1, CHP2 and CHPn may be enabled one by one for each of the package input-output pads PDS1, PDS2 and PDSn and thus searching for the optimum code may be performed simultaneously for all of the memory chips CHP1~CHPn. For the simultaneous search, it is sufficient that the number of the input-output pads per memory chip is larger than the number of the memory chips.

According to the different values of the selection control signals SEL1~SELn, the path selectors MUX1~MUXn in the memory chips CHP1~CHPn may select the reception units so that the one reception unit may be enabled per package input-output pad and provide the buffer signals of the selected reception units as the selection buffer signals to the self-training circuits STC1~STCn, respectively.

The self-training circuits STC1~STCn may search for code values of the optimum code OCD corresponding to the selected reception units respectively based on the selection control signals SEL1~SELn during the training mode. The reference voltage generators RVG1~RVGn may provide the reference voltages VREF1~VREFn corresponding to the code values of the optimum code OCD respectively to the reception units in the respective memory chips CHP1~CHPn during the normal mode.

At time point T3, the self-training is completed and the memory controller 24 may deactivate the chip enable signals CE1~CEn to the logic high level. The memory controller 24 may disable the transmission drivers and the input signals SI1~SIn may return to the original state, for example, to the high-impedance state.

At time point T4, the memory controller 24 may activate the chip enable signals CE1~CEn to the logic low level, which are applied to the memory device 44. When the chip enable signals CE1~CEn are activated, the corresponding memory chips CHP1~CHPn in the memory device 43 may be selected and enabled.

At time point T5, the memory controller 24 may transfer a voltage set command VST indicating the end of the training mode to the memory device 44. The memory device 44 may deactivate the mode signal MD to inform that the current operation mode is the normal mode to the self-training circuits STC1~STCn. The self-training circuits STC1~STCn may store the code values of the optimum code OCD in the registers REG respectively and the reference voltage generators RVG1~RVGn may provide the reference voltages VREF1~VREFn to the memory chips CHP1~CHPn respectively based on the code values of the optimum code OCD during the normal mode.

As described with reference to FIGS. 25 and 26, in a multi-chip package 44 according to example embodiments, a plurality of chip enable signals CE1~CEn may be activated simultaneously and the input signals SI1~SIn may be applied to the package input-output pads PDS1~PDSn simultaneously to perform the self-training for the memory chips CHP1~CHPn simultaneously. In performing the simultaneous self-training, the selection control signals SEL1~SELn may have the different values so that only one reception unit may be enabled per the package input-output pad, and thus the operation condition in the training mode may be implemented similarly as the normal mode during which only one memory chip is selected and enabled at one time.

As can be seen from the above discussion of FIGS. 25 and 26, in some embodiments, a memory system includes a controller including a plurality of input/output pads configured to transmit a plurality of respective data signals, and a memory device including a plurality of memory chips, each memory chip including a plurality of input/output pads respectively connected to the input/output pads of the controller. Each individual memory chip may include plurality of buffers, wherein each buffer is connected to a respective input/output pad of the individual memory chip to receive an input signal, and each buffer outputs a buffer output signal. A reference voltage generator may be included on each individual memory chip. The reference voltage generator may be connected to at least one buffer on the respective individual memory chip. By using the example configuration and method described in connection with FIGS. 25 and 26, the memory system is configured to perform reference voltage training on a first chip of the plurality of memory chips using output from a first i/o pad of the controller at the same time as performing reference voltage training on a second chip of the plurality of memory chips using output from a second i/o pad of the controller. Each memory chip can include a selection circuit, and each selection circuit may be configured to select one of the buffer output signals for that chip to use to adjust the reference voltage generated by the reference voltage generator for that chip. In some implementations, a self-training circuit on each semiconductor chip of the memory device may be connected between a respective selection circuit and a respective reference voltage generator, and each self-training circuit forms a loop with a respective buffer and respective reference voltage generator. Also, in some implementations as can be seen above in connection with FIGS. 25 and 26, each self-training circuit can be configured to apply a training control code to a corresponding reference voltage generator during a training mode and to apply an operational control code to the corresponding reference voltage generator during a normal operating mode.

The reception interface circuits, methods, and systems described above can be used in a variety of different types of semiconductor devices or electronic devices. For example, they may be used to control a reference voltage in buffers of a flash memory device, such as a NAND memory device storing one-bit per cell data or multi-bit per cell data, a NOR memory device, or a vertical memory device such as VNAND. As another example, the reception interface circuits, methods, and systems described above may be used to control a reference voltage in buffers of a solid state disk or solid state drive (SSD), an embedded multi-media card (eMMC), a mobile system or device, such as for example, a mobile phone, a smart phone, a personal digital assistant (PDA), a portable multimedia player (PMP), a digital camera, a music player, a laptop computer, a portable game console, or a navigation system, a personal computer (PC), a server computer, a workstation, a digital television, a set-top box, or another type of electronic device particularly that includes nonvolatile memory that can be read using signal-ended signaling or pseudo-differential signaling.

The reception interface circuit according to example embodiments may reduce the training time by searching for the optimal reference voltage using the self-training circuit included in the reception interface circuit of a semiconductor chip or package. In a multi-chip package including a plurality of semiconductor chips, the training time may be reduced significantly by simultaneously searching for the optimal reference voltages of the respective semiconductor chips through different input-output pads.

The reception interface circuit according to example embodiments may provide the optimal reference voltage regardless of system configurations and operational conditions by searching for the optimal reference voltage based on the input signal transferred from the transmitter, and thus performance of a system including the reception interface circuit may be enhanced.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept.

We claim:

1. A method of self-training of a reference voltage of a semiconductor device, the method comprising:
   performing a training mode, including:
   (a) generating, by a reference voltage generator, a training reference voltage corresponding to a training control code, the training reference voltage having a first voltage level and the training control code having a first value and being received from a self-training circuit of the semiconductor device;
   (b) inputting the training reference voltage and an input signal into a first buffer and based on the training reference voltage and the input signal, outputting a buffer output signal from the first buffer;
   (c) changing the training control code by the self-training circuit to have a second value different from the first value, and in response, generating the training reference voltage to have a second voltage level corresponding to the second value; and
   (d) performing steps (b) and (c) for n additional times, each time using a different value of the training control code to generate a different training reference voltage level, and each time inputting the training reference voltage and the input signal into the first buffer, wherein n is an integer equal to or greater than 2; and
   based on the different voltage levels and their resulting buffer output signals, selecting one of the values of the training control codes as the value of an operational control code used to generate an operational reference voltage during a normal mode of operation of the semiconductor device;
   wherein the first buffer, the self-training circuit, and the reference voltage generator form a loop, and
   wherein the input signal has a high voltage level that is constant for a period of time, and further comprising:
   determining two of the voltage levels that are closest to the high voltage level; and
   selecting as the operational control code a value that is determined based on one of the two voltage levels.

2. The method of claim 1, further comprising:
   storing the different values of the training control codes in a register, and outputting one of the different stored values as the operational control code.

3. The method of claim 1, wherein the training mode is performed in response to a mode signal received from a controller, the mode signal indicating the start of a training mode.

4. The method of claim 3, wherein the training mode is ended in response to a mode signal received from the controller, the mode signal indicating an end of the training mode.

5. The method of claim 1, wherein the semiconductor device is a semiconductor chip, and steps (a) through (d) are performed on the semiconductor chip.

6. The method of claim 5, wherein the training reference voltage of step (a) is generated without being based on a reference voltage received from a device external to the semiconductor chip.

7. The method of claim 1, further comprising:
   performing steps (a) through (d) a first time for an input signal that has a high voltage level that is constant for a period of time;

determining first and second of the voltage levels that are closest to the high voltage level during the first time of performing steps (a) through (d);

performing steps (a) through (d) a second time for an input signal that has a low voltage level that is constant for a period of time;

determining third and fourth of the voltage levels that are closest to the low voltage level during the second time of performing steps (a) through (d); and selecting as the operational control code a value that is determined based on at least one of the first and second voltage levels and at least one of the third and fourth voltage levels.

8. The method of claim 1, wherein the input signal has a toggling high and low voltage level having a particular frequency, and further comprising:

generating the operational reference voltage based on a duty ratio of the buffer output signal.

9. The method of claim 8, wherein the input signal is passed through a low pass filter and an output of the low pass filter is input along with a reference signal to a comparator, and the output from the comparator is used to control the training control code.

10. The method of claim 1, further comprising:
receiving the input signal at a memory device from a memory controller.

11. The method of claim 1, wherein the semiconductor device includes a plurality of first buffers, and further comprising:

selecting one first buffer from among the plurality of first buffers, and performing steps (a) through (d) on the selected first buffer.

12. The method of claim 1, wherein the changed training control code is input to the reference voltage generator internally within the semiconductor device.

13. A method of self-training of a reference voltage of a semiconductor device that includes a plurality of memory chips, the method comprising:

performing a training mode, including:
(a) generating a training reference voltage corresponding to a training control code, the training reference voltage having a first voltage level and the training control code having a first value;
(b) inputting the training reference voltage and an input signal into a reception buffer and based on the training reference voltage and the input signal, outputting a buffer output signal from the reception buffer;
(c) changing the training control code to have a second value different from the first value, and in response, generating the training reference voltage to have a second voltage level corresponding to the second value; and
(d) performing steps (b) and (c) for n additional times, each time using a different value of the training control code to generate a different training reference voltage level, and each time inputting the training reference voltage and the input signal into the reception buffer, wherein n is an integer equal to or greater than 2;

based on the different voltage levels and their resulting buffer output signals, selecting one of the values of the training control codes as the value of an operational control code used to generate an operational reference voltage during a normal mode of operation of the semiconductor device; and performing the training mode for a first memory chip of the plurality of memory chips at the same time as performing the training mode for a second memory chip of the plurality of memory chips.

14. The method of claim 13, wherein:
each memory chip includes a plurality of reception units, each reception unit configured to compare the input signal to a training reference voltage.

15. The method of claim 14, further comprising:
performing steps (a) through (d) on a first reception unit of the first memory chip at the same time as performing steps (a) through (d) on a second reception unit of the second memory chip;

wherein the first reception unit of the first memory chip is connected to receive an input signal from a first input/output line of the semiconductor device, and the second reception unit of the second memory chip is connected to receive an input signal from a second input/output line of the semiconductor device, the first input/output line shared in common between the first memory chip and second memory chip, and the second input/output line shared in common between the first memory chip and the second memory chip and different from the first input/output line.

16. The method of claim 15, wherein performing the training mode for the first memory chip at the same time as performing the training mode for the second memory chip includes operating the first reception unit at the same time as operating the second reception unit.

17. The method of claim 15, further comprising:
a first reference voltage generator on the first memory chip and a second reference voltage generator on the second memory chip;

selecting a first output from the first reception unit using a first selection circuit, and using the selected first output to control the reference voltage generated by the first reference voltage generator; and selecting a second output from the second reception unit using a second selection circuit, and using the selected second output to control the reference voltage generated by the second reference voltage generator.

18. A semiconductor device, comprising:
at least a first memory chip including:
at least a first buffer connected to receive an input signal and a first reference voltage having a first voltage level;
at least a first reference voltage generator configured to output the first reference voltage having the first voltage level based on a first control code and to output a plurality of additional reference voltages having different additional voltage levels based on a plurality of respective additional control codes; and
at least a first self-training circuit for determining an operational reference voltage to use during a normal mode of operation of the semiconductor device, wherein:

an output from the first buffer is input to the first self-training circuit,
the first control code is output from the first self-training circuit into the first reference voltage generator,
the first buffer, the first self-training circuit, and the first reference voltage generator form a loop, and
the input signal has a high voltage level that is constant for a period of time, and further comprising:
determining two of the voltage levels from among the first voltage level and the additional voltage levels that are closest to the high voltage level; and generating the operational reference voltage based on one of the two voltage levels.

19. The semiconductor device of claim 18, wherein:
the first self-training circuit includes a first search logic circuit configured to output training control codes having different values, the different values causing the first reference voltage generator to generate reference voltages having different respective voltage levels.

20. A memory system comprising:
a controller, the controller including a plurality of input/output pads configured to transmit a plurality of respective data signals;
a memory device including a plurality of memory chips, each memory chip including a plurality of input/output pads respectively connected to the input/output pads of the controller;
a plurality of buffers on each individual memory chip, each buffer connected to a respective input/output pad of the individual memory chip to receive an input signal, and each buffer outputting a buffer output signal; and
a reference voltage generator on each individual memory chip, the reference voltage generator connected to at least one buffer on the respective individual memory chip,
wherein the memory system is configured to perform reference voltage training on a first chip of the plurality of memory chips using output from a first i/o pad of the controller at the same time as performing reference voltage training on a second chip of the plurality of memory chips using output from a second i/o pad of the controller.

* * * * *